(12) United States Patent
Tada et al.

(10) Patent No.: US 8,816,312 B2
(45) Date of Patent: Aug. 26, 2014

(54) SEMICONDUCTOR DEVICE

(75) Inventors: Munehiro Tada, Tokyo (JP); Makoto Miyamura, Tokyo (JP); Hiromitsu Hada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/824,098

(22) PCT Filed: Sep. 20, 2011

(86) PCT No.: PCT/JP2011/071945
§ 371 (c)(1),
(2), (4) Date: Mar. 15, 2013

(87) PCT Pub. No.: WO2012/043502
PCT Pub. Date: Apr. 5, 2012

(65) Prior Publication Data
US 2013/0181180 A1 Jul. 18, 2013

(30) Foreign Application Priority Data

Sep. 28, 2010 (JP) .................... 2010-216732
Jul. 25, 2011 (JP) .................... 2011-162315

(51) Int. Cl.
*H01L 29/00* (2006.01)
(52) U.S. Cl.
USPC ........... 257/1; 257/3; 257/41; 257/529; 438/3
(58) Field of Classification Search
USPC .................. 257/41, 529, 536, 776, E45.002, 257/E21.663, E27.047; 438/3
See application file for complete search history.

(56) References Cited

U.S. PATENT DOCUMENTS

| | | | |
|---|---|---|---|
| 7,061,013 B2 | 6/2006 | Hideki | |
| 7,387,938 B2 | 6/2008 | Hideki | |
| 7,425,720 B2 | 9/2008 | Kaeriyama et al. | |
| 7,750,431 B2 | 7/2010 | Hideki | |
| 7,781,230 B2 | 8/2010 | Odagawa et al. | |
| 7,825,408 B2 | 11/2010 | Kaeriyama et al. | |

(Continued)

FOREIGN PATENT DOCUMENTS

| | | | |
|---|---|---|---|
| JP | 2004-274055 A | 9/2004 | |
| JP | 2005-101535 A | 4/2005 | |

(Continued)

OTHER PUBLICATIONS

Shunichi Kaeriyama et al., A Nonvolatile Programmable Solid-Electrolyte Nanometer Switch, IEEE Journal of Solid-State Circuits, Jan. 2005, pp. 168-176, vol. 40, No. 1.

*Primary Examiner* — Mark A Laurenzi
(74) *Attorney, Agent, or Firm* — Foley & Lardner LLP

(57) ABSTRACT

A semiconductor device according to the present invention includes: an unit element which includes a first switch and a second switch, wherein each of the first switch and the second switch includes an electrical resistance changing layer whose state of electrical resistance is changed according to a polarity of an applied voltage, and each of the first switch and the second switch has two electrodes, and wherein one electrode of the first switch and one electrode of the second switch are connected each other to form a common node, and the other electrode of the first switch forms a first node, and the other electrode of the second switch forms a second node; a first wiring which is connected with the first node and forms a signal transmission line; and a second wiring which is connected with the second node and is connected with the first wiring through the unit element.

20 Claims, 28 Drawing Sheets

(56) References Cited

U.S. PATENT DOCUMENTS

| | | |
|---|---|---|
| 8,084,768 B2 | 12/2011 | Kaeriyama et al. |
| 8,259,489 B2 | 9/2012 | Nagashima et al. |
| 2007/0240995 A1 | 10/2007 | Odagawa et al. |
| 2010/0213433 A1 | 8/2010 | Yamamoto et al. |

FOREIGN PATENT DOCUMENTS

| | | |
|---|---|---|
| JP | 2006-32867 A | 2/2006 |
| JP | 2007-258533 A | 10/2007 |
| JP | 2007-287761 A | 11/2007 |
| JP | 2009-099198 A | 5/2009 |
| JP | 2006-147666 A | 6/2009 |
| JP | 2010-192800 A | 9/2010 |

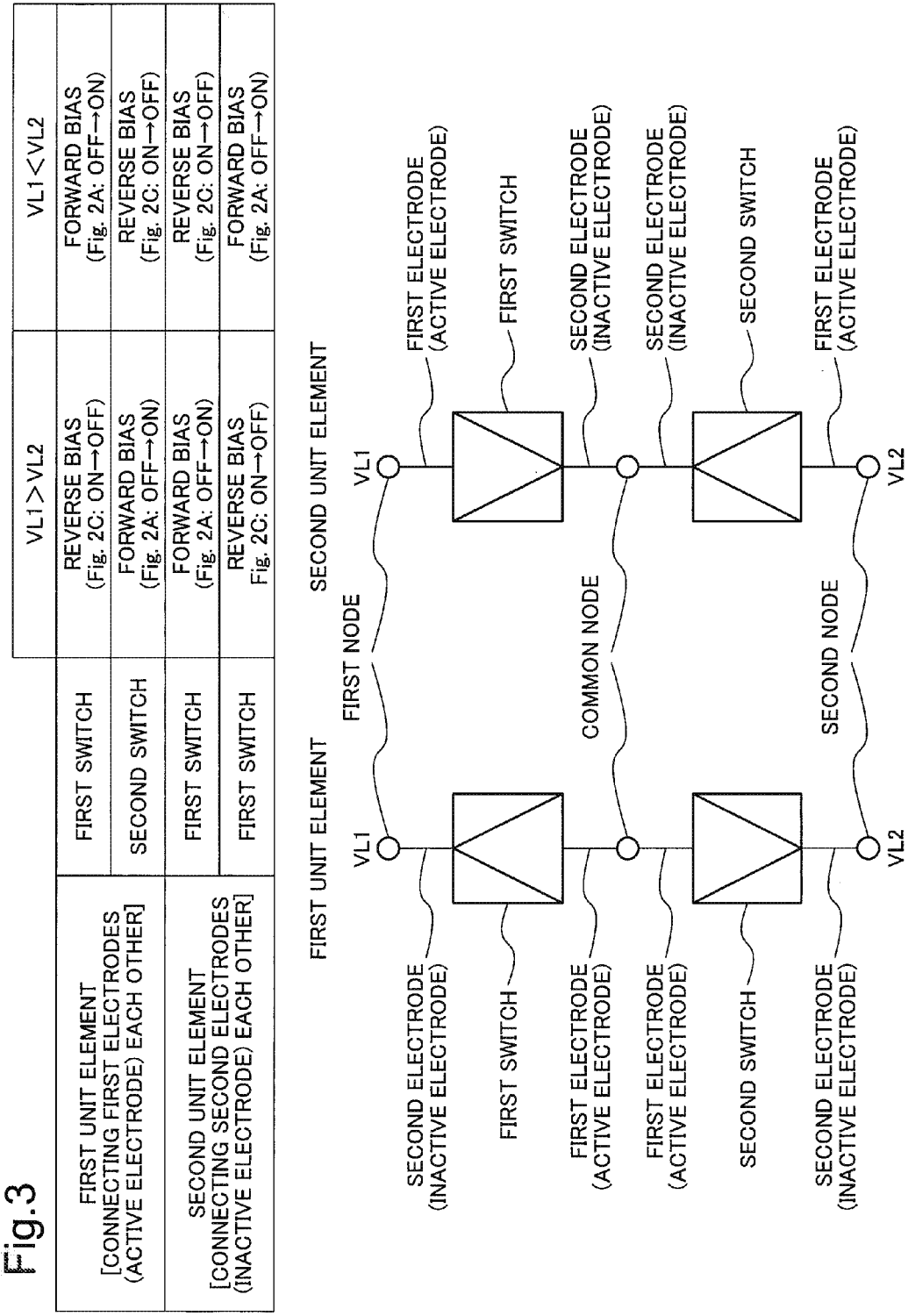

SEMICONDUCTOR DEVICE

This application is the National Phase of PCT/JP2011/071945, filed Sep. 20, 2011, which claims priority to Japanese Application Nos. 2010-216732, filed Sep. 28, 2010 and 2011-162315, filed Jul. 7, 2011, the disclosures of which are hereby incorporated by reference in their entirety.

TECHNICAL FIELD

The present invention relates to a semiconductor device, and particularly relates to a semiconductor device which installs an electrical resistance changing type nonvolatile element (hereinafter, described as switching element).

BACKGROUND ART

The semiconductor device, especially the silicon device has been progressed in the large scale integration and the low power consumption through applying the fine rule (scaling rule: Moore's rule), and has been developed in a pace of 4 times larger per three years. In recent years, the gate length of MOSFET (Metal Oxide Semiconductor Field Effect Transistor) becomes not longer than 20 nm. As a result, a steep rise in a cost of the lithography process (price of an apparatus and a mask set), and physical limitation on the device size (limitation in an operation and limitation due to a manufacturing deviation) are caused.

Then, it is required to improve device performance through applying an approach different from the conventional scaling rule. In order to cope with the limitation, in recent years, a programmable logic device which is re-writable and which is called FPGA has been developed as an intermediate device between the gate array and the standard cell. After a chip is manufactured, a customer carries out a wiring connection on the chip. It is expected that the low lower consumption may be realized furthermore through using an electrical resistance changing element inside the multi-layered wiring layers of FPGA.

As the electrical resistance changing element, ReRAM (Resistance Random Access Memory) using the transition metal oxide, NanoBridge (registered trademark of NEC) using the ion conductor or the like is exemplified. A patent document 1 and a non-patent document 1 disclose an electrical resistance changing element using a mobility of an metal ion and an electrochemical reaction in a solid in which the metal ion can move freely (ion conductor) by application of an electric field or the like. The electrical resistance changing element includes an ion conducting layer, and a first and second electrodes which come into contact with the ion conducting layer and are arranged on opposite surfaces of the ion conducting layer. The metal ion is supplied from the first electrode to the ion conducting layer, and is not supplied from the second electrode. According to the electrical resistance changing element which is disclosed in the patent document 1 and the non-patent document 1, a value of electrical resistance of the ion conductor is changed through changing a polarity of an applied voltage. As a result, a state of conduction between two electrodes is controlled. Moreover, the patent document 1 and the non-patent document 1 disclose ULSI (Ultra-Large Scale Integration) which includes a crossbar switch using the electrical resistance changing device.

<Patent document 1> Japanese Patent Application Laid-Open Publication No. 2005-101535
<Non-patent document 1> Shunichi Kaeriyama et al., "A Nonvolatile Programmable Solid-Electrolyte Nanometer Switch", IEEE Journal of Solid-State Circuits, Vol. 40, No. 1, pp. 168-176, January 2005.

DISCLOSURE OF THE INVENTION

However, the electrical resistance changing element, which is described in the patent document 1 and the non-patent document 1, has the following problem. It is taken into consideration in the following that the electrical resistance changing element is applied to the crossbar switch which is used for connecting and disconnecting a signal line in Upsizing this case, a false writing (OFF disturbance) may be caused sometimes to the electrical resistance changing element, which is in a state of high electrical resistance, due to a logic amplitude of a signal such as an external noise or the like. Particularly, in the case that a programming voltage of the electrical resistance changing element becomes lowered in order to make the programming voltage almost equivalent to an operating voltage of a logic LSI, the above-mentioned OFF disturbing problem becomes more severe. As a result, there is a problem that it is difficult that to make the programming voltage lowered and to make immunity against the OFF disturbing problem strong are made compatible each other.

An object of the present invention is to provide a semiconductor device which prevents the OFF disturbance from being caused and which is able to realize high reliability and to make a driving voltage lowered.

Means to Solve the Problem

In order to solve the problem mentioned above, a semiconductor device according to the present invention is characterized by comprising: an unit element including a first switch and a second switch, wherein each of the first switch and the second switch includes an electrical resistance changing layer whose state of the electrical resistance is changed according to a polarity of an applied voltage, and each of the first switch and the second switch has two electrodes, and wherein one electrode of the first switch and one electrode of the second switch are connected each other to form a common node, the other electrode of the first switch forms a first node, and the other electrode of the second switch forms a second node; a first wiring which is connected with the first node and forms a signal transmission line; and a second wiring which is connected with the second node and is connected with the first wiring through the unit element.

Effect of the Invention

According to the present invention, the semiconductor device can provide high reliability and make the driving voltage lowered.

BRIEF DESCRIPTION OF THE DRAWINGS

FIG. 3 shows a summary of operations of a unit element.

DETAILED DESCRIPTION OF THE INVENTION

A meaning of terminology related to the present invention will be described before describing the present invention in detail.
(Explanation on Bipolar Type Switch and Unipolar Type Switch)
<Unipolar Type Switch>
An unipolar type switch is a switching element which transits between an OFF state (state of high electrical resistance) and an ON state (state of low electrical resistance) according to a value of an applied voltage.

Operation properties of the unipolar type switch will be described with reference to FIGS. 1A to 1D. FIG. 1A to 1D shows the operation properties of the unipolar type switch.

Here, composition that an electrical resistance changing layer is interposed between a first electrode and a second electrode will be taken into consideration as the unipolar type switch. Then, a positive voltage is applied to the first electrode. When the applied voltage exceeds a predetermined set voltage, the unipolar type switch transits from the OFF state to the ON state (FIG. 1A).

Here, the set voltage and a reset voltage, which will be described later, means characteristic values which are determined dependently on a film thickness, composition, density, or the like of an electrical resistance changing layer. Moreover, the set voltage means a voltage to make a value of electrical resistance of the electrical resistance changing layer transit from the OFF state, which is corresponding to the state of high electrical resistance, to the ON state which is corresponding to the state of low electrical resistance. Meanwhile, the reset voltage means a voltage to make the value of electrical resistance of the electrical resistance changing layer transit conversely from the ON state to the OFF state.

When a voltage larger than a reset voltage is applied to the unipolar type switch which has been in the ON state, the unipolar type switch transits from the ON state to the OFF state. When the applied positive voltage is enlarged furthermore so as to exceed a set voltage, the unipolar type switch transits from the OFF state to the ON state again (FIG. 1B).

Figure 1B:
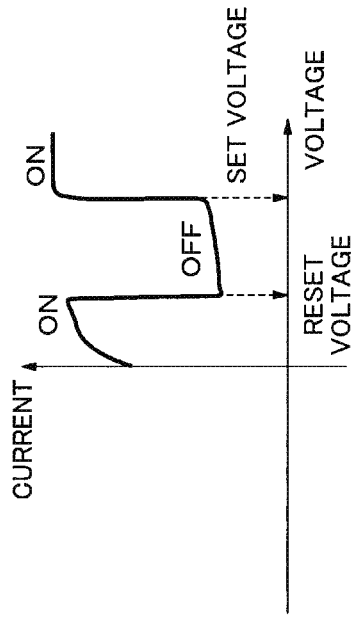
FIG. 1B shows operation properties which are obtained when applying a positive voltage higher than a reset voltage to the first electrode of the unipolar type switching element.
Figure 1A:
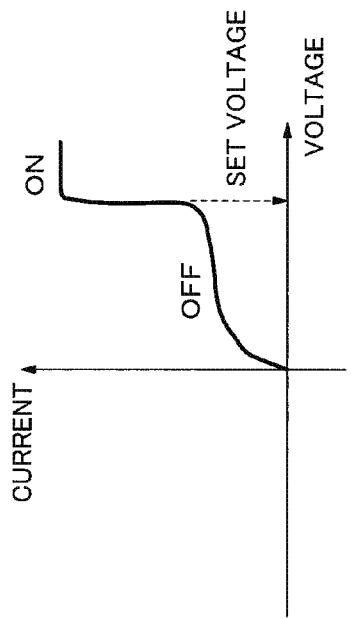
FIG. 1A shows operation properties which are obtained when applying a positive voltage to a first electrode of an unipolar type switching element.
Figure 1D:
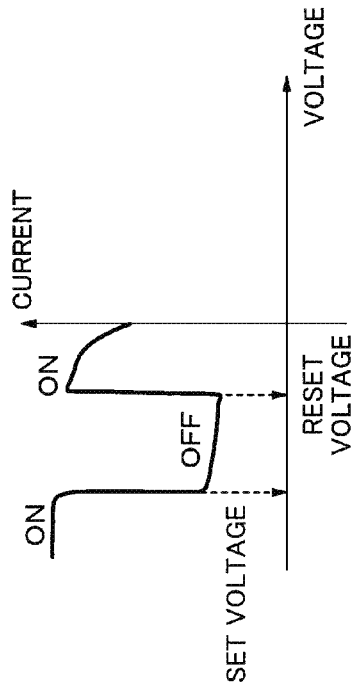
FIG. 1D shows operation properties which are obtained when applying a negative voltage lower than a reset voltage to the first electrode of the unipolar type switching element.
Figure 1C:
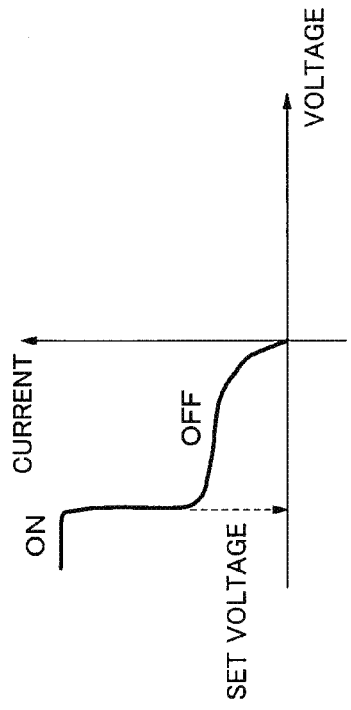
FIG. 1C shows operation properties which are obtained when applying a negative voltage to the first electrode of the unipolar type switching element.

On the other hand, when a negative voltage is applied to the first electrode, and a value of the negative voltage becomes lower than a set voltage, the unipolar type switch transits from the OFF state to the ON state (FIG. 1C).

When the value of the negative voltage applied to the first electrode becomes lower than a reset voltage, the unipolar type switch, which has been in the ON state, transits from the ON state to the OFF state. When the value of the applied negative voltage becomes lower than a set voltage, the unipolar type switch transits from the ON state to the OFF state again (FIG. 1D).

As mentioned above, the unipolar type switch is characterized in that the unipolar type switch has the electrical resistance changing properties shown in FIG. 1A and FIG. 1B and the electrical resistance changing properties shown in FIG. 1C and FIG. 1D which are dependent on not the polarity of the applied voltage but only an absolute value of the applied voltage.
<Bipolar Type Switch>
While the unipolar type switch has the above-mentioned properties, a bipolar type switch is a switching element which transits between an OFF state and an ON state according to a polarity of an applied voltage (in the case that a voltage applied to a first electrode is higher than a voltage applied to a second electrode, the voltage applied to the first electrode is defined as a positive polarity.).

FIG. 2A to 2D shows operation properties of the bipolarity type switch. Here, composition that an ion conductor, which works as an electrical resistance changing layer, is interposed between the first electrode and the second electrode will be taken into consideration as the bipolar type switch. Then, a positive voltage is applied to the first electrode. When a value of the applied voltage exceeds a set voltage, the bipolar type switch transits from the OFF state to the ON state (see FIG. 2A). Hereinafter, the above-mentioned voltage applying condition is described as a forward bias.

Figure 2A:
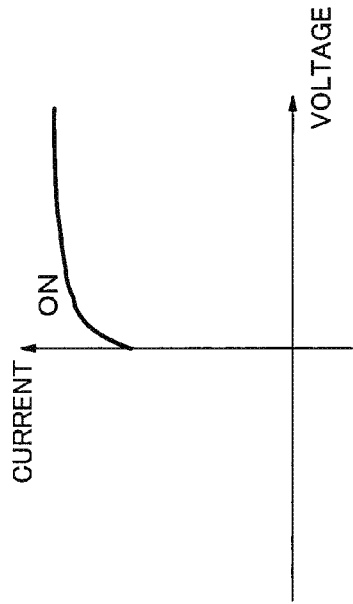
FIG. 2A shows operation properties which are obtained when applying a positive voltage to a first electrode of a bipolar type switching element.
Figure 2B:
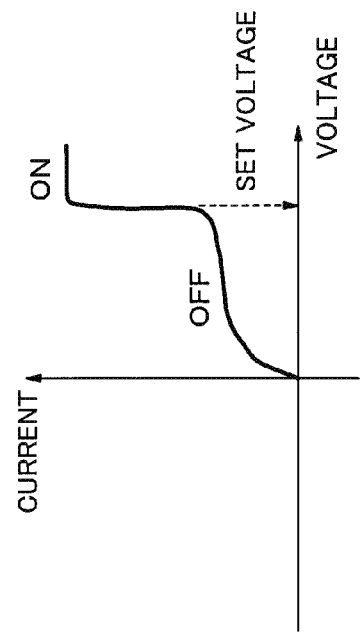
FIG. 2B shows operation properties which are obtained when applying a positive voltage higher than a set voltage to the first electrode of the bipolar type switching element.

Next, when the value of the applied voltage is enlarged furthermore, the bipolar type switch provides ohmic voltage-current properties (see FIG. 2B).

Next, a negative voltage is applied to the first electrode. When the value of the applied negative voltage becomes lower than a reset voltage, the bipolar type switch transits from the ON state to the OFF state (see FIG. 2C). Hereinafter, the above-mentioned voltage applying condition is described as a reverse bias.

Furthermore, a positive voltage is applied again to the first electrode of the bipolar type switch which has been in the OFF state. In the case that a value of the positive voltage becomes larger than a set voltage, the bipolar type switch transits from the OFF state to the ON state (see FIG. 2D). As mentioned above, the bipolar type switch transits between the OFF state and the ON state according to the polarity of the applied voltage.
<Definition of Electrode Used in Bipolar Type Switch>
Here, an electrode, which is used in the bipolar type switch, will be defined. An electrode, which transits from the OFF state to the ON state in the case of applying a positive voltage as shown in FIG. 2A, is defined as a first electrode or an active electrode. On the other hand, an electrode, which transits from the ON state to the OFF state in the case of applying a negative voltage, is defined as a second electrode or an inactive electrode.

Similarly, an electrode, which transits from the ON state to the OFF state in the case of applying a positive voltage, is defined as the second electrode or the inactive electrode. On the other hand, an electrode, which transits from the OFF state to the ON state in the case of applying a negative voltage, is defined as the first electrode or the active electrode.

An unit element, in which the first electrodes of two bipolar type switches are connected each other, or two second electrodes of the two bipolar type switches are connected each other, is used in each exemplary embodiment shown in the following. That is, if two bipolar type switches are denoted as a first switch and a second switch respectively, the unit element is formed so that the first switch and the second switch may be connected each other. Here, a method for connecting the electrodes each other includes a method of connecting directly the first electrodes or the second electrodes of the first switch and the second switch each other, or a method of connecting the electrodes each other by use of another material.

The unit element in which two first electrodes are connected each other is defined as a first unit element, and the unit element in which two second electrodes are connected each other is defined as a second unit element. Moreover, a point where the electrodes of the first switch and the second switch are connected each other is defined as a common node, and a point corresponding to the other electrode of the first switch is defined as a first node, and a point corresponding to the other electrode of the second switch is defined as a second node.

Here, a voltage of the first node, and a voltage of the second node are denoted as VL1 and VL2 respectively. Then, the first switch and the second switch in the first unit element or the second unit element respectively operate as follows. This relation is summarized in FIG. 3.

Figure 2C:
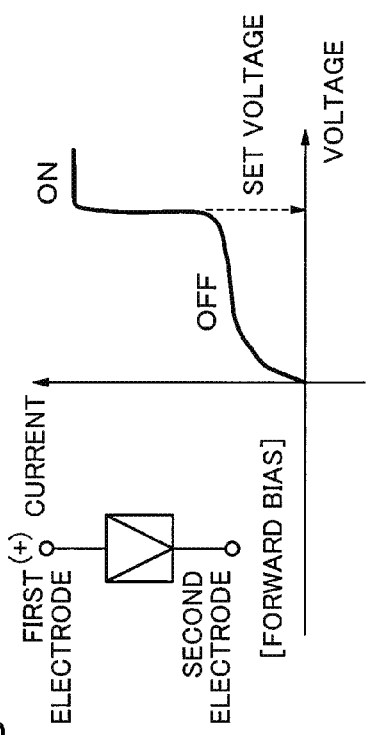
FIG. 2C shows operation properties which are obtained when applying a negative voltage lower than a reset voltage to the first electrode of the bipolar type switching element.
Figure 2D:
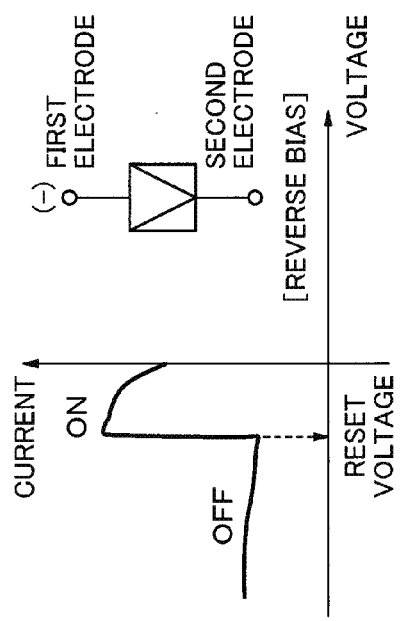
FIG. 2D shows operation properties which are obtained when applying a positive voltage higher than a set voltage to the first electrode of the bipolar type switching element.
Figure 4A:
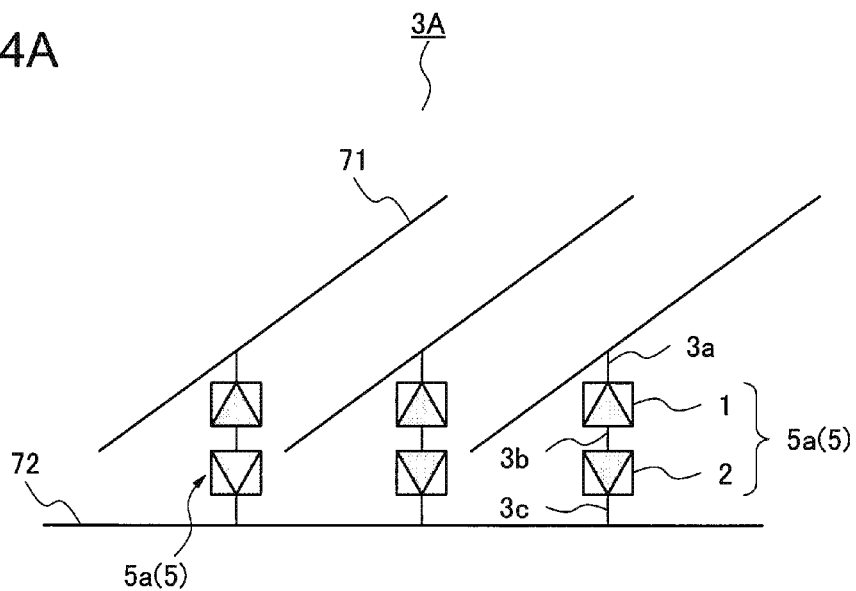
FIG. 4A shows a composition of a semiconductor device, which uses a first unit element, according to the first exemplary embodiment of the present invention.
Figure 4B:
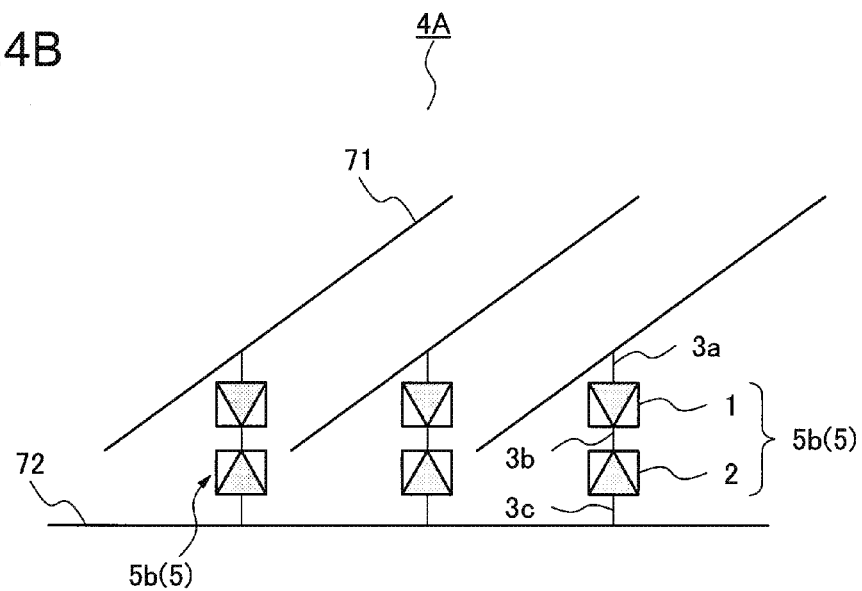
FIG. 4B shows composition of a semiconductor device, which uses a second unit element, according to the first embodiment of the present invention.

(1) In the case of VL1>VL2
[a] First switch of first unit element: reverse bias, electrical resistance changing properties shown in FIG. 2C
[b] Second switch of first unit element: forward bias, electrical resistance changing properties shown in FIG. 2A
[c] First switch of second unit element: forward bias, electrical resistance changing properties shown in FIG. 2A
[d] Second switch of second unit element: reverse bias, electrical resistance changing properties shown in FIG. 2C (2) In the case of VL1<VL2
[a] First switch of first unit element: forward bias, electrical resistance changing properties shown in FIG. 2A
[b] Second switch of first unit element: reverse bias, electrical resistance changing properties shown in FIG. 2C
[c] First switch of second unit element: reverse bias, electrical resistance changing properties shown in FIG. 2C
[d] Second switch of second unit element: forward bias, electrical resistance changing properties shown in FIG. 2A First Exemplary Embodiment A first exemplary embodiment of the present invention will be described. FIGS. 4A and 4B shows composition of semiconductor devices 3A and 4A according to the exemplary embodiment. Particularly, FIG. 4A shows the composition of the semiconductor device 3A which uses a first unit element 5a, and FIG. 4B shows the composition of the semiconductor device 4A which uses a second unit element 5b. An unit element 5 (5a and 5b) includes a first switch 1 and a second switch 2.

The semiconductor device 3A includes a plurality of the first unit elements 5a, a plurality of first wirings 71 and a plurality of second wirings 72. It is assumed that each of the first wiring 71 and the second wiring 72 is a transmission line through which a signal is transmitted in the semiconductor device 3A. The first wiring 71 and the second wiring 72 are arranged so that the first wiring 71 and the second wiring 72 may not electrically come into contact each other at least. FIGS. 4A and 4B shows that the first wiring 71 and the second wiring 72 are skewed. Then, the first unit element 5a is arranged at a position where a distance between the first wiring 71 and the second wiring 72 is shortest or at a position near to the shortest distance position (hereinafter, described as cross point).

An electrode of the first switch 1 which is connected with the first wiring 71 is a first node 3a, and an electrode of the second switch which is connected with the second wiring 72 is a second node 3c. Moreover, a connection point of the first switch 1 and the second switch 2 is a common node 3b.

As a result, it is possible to control a state of conduction between the first wiring 71 and the second wiring 72 according to an ON or OFF state of the first unit element 5a.

The semiconductor device 4A also has the similar composition. However, while the semiconductor device 3A includes the first unit element 5a, the semiconductor device 4A is different from the semiconductor device 3A in a point that the semiconductor device 4A includes the second unit device 5b.

Next, an operation of the semiconductor device 3A will be described. Here, it is assumed that the first switch 1 and the second switch 2, which the first unit element 5a includes, are set to be in the OFF state respectively. Then, a work of the first unit element 5a against a noise or the like in the following case will be explained.

(1) A case that a high voltage with the positive polarity which is lower than the set voltage is applied to the first wiring 71, and a low voltage is applied to the second wiring 72

(2) A case that a low voltage is applied to the first wiring 71, and a high voltage with the positive polarity which is lower than the set voltage is applied to the second wiring 72

Here, while terminologies of "high voltage" and "low voltage" are used in the specification, the terminologies do not specify any value of voltage. Since a state of electrical resistance of the unit element is changed on the basis of a difference between a voltage of the first node and a voltage of the second node, and a polarity of the voltage which is applied to each the node, it is a required condition for determining the state of electrical resistance that the voltage of one node is higher or lower than the voltage of the other node. Since that a value of voltage is larger or smaller than the set voltage or the reset voltage determines the state of electrical resistance, description such as "high voltage with positive polarity which is lower than set voltage" or the like will be used if it is necessary to specify the value of voltage. Furthermore, the low voltage includes the ground potential.

(1) The case that the high voltage with the positive polarity which is lower than the set voltage is applied to the first wiring 71, and the low voltage is applied to the second wiring 72

This bias condition means that the voltage of the first node 3a (VL1) is higher than the voltage of the second node 3c (VL2), that is VL1>VL2. Accordingly, the first switch 1 enters into the state of reverse bias and works according to the electrical resistance changing properties shown in FIG. 2C. According to this bias condition, the first switch 1 does not transit to the ON state. That is, a voltage, which is in a direction to make the first switch 1 transit from the ON state to the OFF state, is applied to the first switch 1. On the other hand, since this bias condition means the forward bias for the second switch 2, the second switch 2 works according to the electrical resistance changing properties shown in FIG. 2A. That is, a voltage, which is in a direction to make the second switch 2 transit from the OFF state to the ON state, is applied to the second switch 2.

Next, a case that an external noise or the like intrudes on this bias condition is taken into consideration. Since the voltage, which is in the direction to make the second switch 2 transit from the OFF state to the ON state, is applied to the second switch 2, there is a fear that the second switch 2 may carry out a false work and transit to the ON state due to the false work, if the noise or the like intrudes into the second switch 2. However, since the voltage, which is in the direction to make the first switch 1 transit from the ON state to the OFF state, is applied to the first switch 1, the first switch 1 maintains the OFF state even if the noise or the like intrudes into the first switch 1. Accordingly, since at least the first switch 1 maintains the OFF state, the first unit element 5a maintains the OFF state. Therefore, the first unit device 5a does not carry out any false work.

(2) The case that the low voltage is applied to the first wiring 71, and the high voltage with the positive polarity which is lower than the set voltage is applied to the second wiring 72

This bias condition means that the voltage of the first node 3a (VL1) is lower than the voltage of the second node 3c (VL2), that is VL1<VL2. Accordingly, the first switch 1 enters into the state of forward bias and works according to the electrical resistance changing properties shown in FIG. 2A. In this case, a voltage, which is in a direction to make the first switch 1 transit from the OFF state to the ON state, is applied to the first switch 1. Meanwhile, the second switch 2 enters into the state of reverse bias and works according to the electrical resistance changing properties shown in FIG. 2C. Accordingly, a voltage, which is in a direction to make the second switch 2 transit from the ON state to the OFF state, is applied to the second switch 2.

Next, a case that an external noise or the like intrudes on the above-mentioned bias condition is taken into consideration. Since the voltage, which is in the direction to make the first switch 1 transit from the OFF state to the ON state, is applied to the first switch 1, there is a fear that the first switch 1 may carry out a false work and transit to the ON state due to the false work, if the noise or the like intrudes into the first switch 1. Meanwhile, since the voltage, which is in the direction to make the first switch 2 transit from the ON state to the OFF state, is applied to the second switch 2, the second switch 2 maintains the OFF state even if the noise or the like intrudes into the switch 2. Accordingly, since at least the second switch 2 maintains the OFF state, the first unit element 5a maintains the OFF state. Therefore, the first unit device 5a does not carry out any false work.

Next, an operation of the semiconductor apparatus 3B will be described. It is assumed that the first switch 1 and the second switch 2, which the second unit element 5b includes, are set to be in the OFF state respectively. Then, a work of the first unit element 5b against the noise or the like in the following case will be explained.

(1) A case that a high voltage with the positive polarity which is lower than the set voltage is applied to the first wiring 71, and a low voltage is applied to the second wiring 72

(2) A case that a low voltage is applied to the first wiring 71, and a high voltage with the positive polarity which is lower than the set voltage is applied to the second wiring 72

(1) The case that the high voltage with the positive polarity which is lower than the set voltage is applied to the first wiring 71, and the low voltage is applied to the second wiring 72

This bias condition means that the voltage of the first node (VL1) is higher than the voltage of the second node (VL2), that is VL1>VL2. Accordingly, the first switch 1 enters into the state of reverse bias and works according to the electrical resistance changing properties shown in FIG. 2A. In this case, a voltage, which is in the direction to make the first switch 1 transit from the OFF state to the ON state, is applied to the first switch 1. Meanwhile, the second switch 2 enters into the state of reverse bias and works according to the electrical resistance changing properties shown in FIG. 2C. That is, a voltage, which is in the direction to make the second switch 2 transit from the ON state to the OFF state, is applied to the second switch 2.

Here, a case that an external noise or the like intrudes on the above-mentioned bias condition is taken into consideration. Since the voltage, which is in the direction to make the first switch 1 transit from the OFF state to the ON state, is applied to the first switch 1, there is a fear that the first switch 1 may carry out a false work and transit to the ON state due to the false work if the noise or the like intrudes into the first switch 1. Meanwhile, since the voltage, which is in the direction to make the second switch 2 transit from the ON state to the OFF state, is applied to the second switch 2, the second switch 2 maintains the OFF state even if the noise or the like intrudes into the second switch 2. Accordingly, since at least the second switch 2 maintains the OFF state, the first unit element 5b does not carry out a false work and maintains the OFF state.

(2) The case that the low voltage is applied to the first wiring 71, and the high voltage with the positive polarity which is lower than the set voltage is applied to the second wiring 72

This bias condition means that the voltage of the first node (VL1) is lower than the voltage of the second node (VL2), that is, VL1<VL2. Accordingly, the first switch 1 enters into the state of reverse bias and works according to the electrical resistance changing properties shown in FIG. 2C. That is, a voltage, which is in the direction to make the first switch 1 transit from the ON state to the OFF state, is applied to the first switch 1. Meanwhile, the second switch 2 enters into the state of forward bias and works according to the electrical resistance changing properties shown in FIG. 2A. That is, a voltage, which is in the direction to make the second switch 2 transit from the OFF state to the ON state, is applied to the second switch 2.

Here, a case that an external noise or the like intrudes on the above-mentioned bias condition is taken into consideration. Since the voltage, which is in the direction to make the first switch 1 transit from the ON state to the OFF state, is applied to the first switch 1, the first switch 1 maintains the OFF state even if the noise or the like intrudes into the first switch 1. Meanwhile, since the voltage, which is in the direction to make the second switch 2 transit from the OFF state to the ON state, is applied to the second switch 2, there is a fear that the second switch 2 may carry out a false work and transit to the ON state due to the false work, if the noise or the like intrudes into the second switch 2. However, since at least the first switch 1 maintains the OFF state, the first unit element 5b does not carry out a false work and maintains the OFF state.

As described above, the first unit element and the second unit element do not carry out the false work (OFF disturbance) since either the first switch or the second switch maintains the OFF state even if the noise or the like intrudes into the first unit element or the second unit element.

Since the unit element is formed so that the first switch and the second switch may be connected each other in series, the voltages which are applied to the first switch and the second switch are obtained through dividing the voltage applied to the unit element on the basis of a ratio of the value of electrical resistance of the first switch to one of the second switch. Accordingly, even if a voltage applied to the unit element is almost the same as the set voltage, the OFF disturbance is not caused to the unit element.

Moreover, reliability of the semiconductor device is improved through applying the unit element, which is not caused or is hardly caused the OFF disturbance, to the semiconductor device. Moreover, in the case that it is assumed to use FPGA as the semiconductor device, it is possible to produce FPGA with high reliability through applying the unit element to FPGA.

Furthermore, since the unit element does not carry out the false work even when the set voltage is lowered, it is possible to make a programming voltage (forming voltage), which is used for setting the ON or OFF state of the unit element, close to an operating voltage of the semiconductor device. Accordingly, it becomes easy to carry out a power supply design related to power supply which is required in the case that the unit element is used in the semiconductor device.

Second Exemplary Embodiment

Next, a second exemplary embodiment according to the present invention will be described. The exemplary embodiment relates to a method for carrying out programming for a unit element (programming for setting ON or OFF state), and composition of the unit element. Here, the same composition as one according to the first exemplary embodiment has the same code as one according to the first exemplary embodiment, and description on the same composition is omitted appropriately.

Figure 5A:
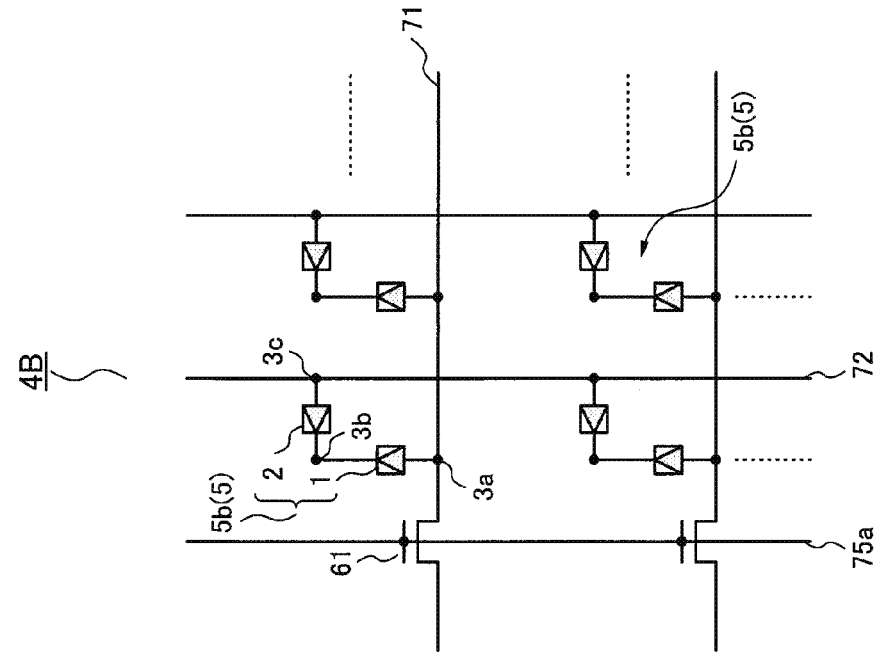
FIG. 5A shows composition of a semiconductor device, which uses a first unit element, according to a second exemplary embodiment of the present invention.
Figure 5B:
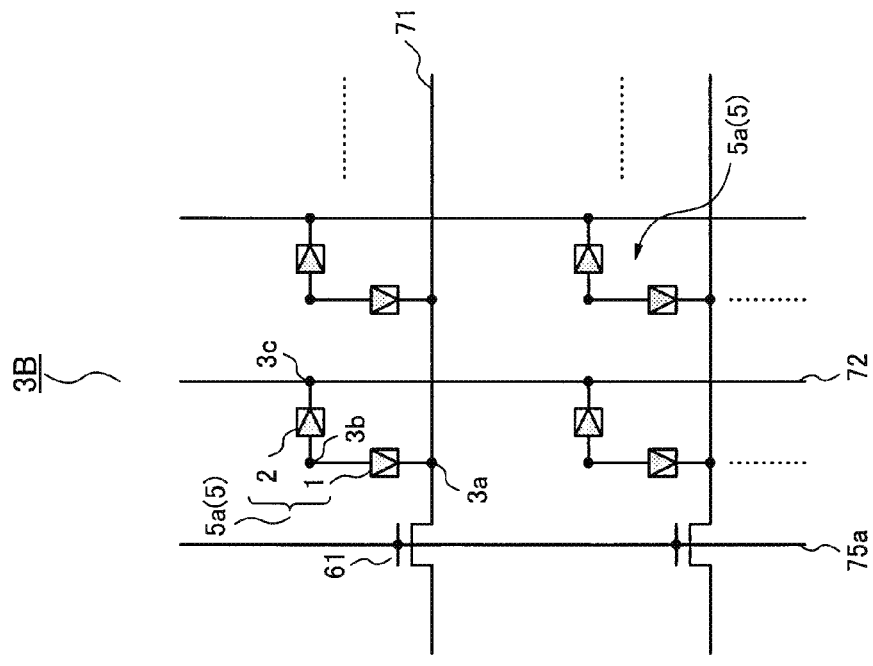
FIG. 5B shows composition of a semiconductor device, which uses a second unit element, according to the second exemplary embodiment of the present invention.

FIGS. 5A and 5B shows composition of semiconductor devices 3B and 4B. Particularly, FIG. 5A shows composition of the semiconductor device 3B which uses the first unit element 5a, and FIG. 5B shows composition of the semiconductor device 4B which uses the second unit element 5b.

In addition to the composition according to the first exemplary embodiment, a plurality of first transistors 61 (power supply connection control transistor 61) and a plurality of first control lines 75a are arranged in each of the semiconductor devices 3B and 4B. Then, a gate of the first transistor 61 is connected with the first control line 75a. Accordingly, the first transistor 61 is turned on and off according to a control signal on the first control line 75a. Moreover, a drain of the first transistor 61 is connected with a first wiring 71, and a high voltage or a low voltage is applied to a source of the first transistor 61.

An operation of the above-mentioned semiconductor devices 3B and 4B will be described. Here, since a programming procedure of the semiconductor device 4B is almost the same as one of the semiconductor device 3B, only the programming procedure of the semiconductor device 3B will be exemplified in the following. It is assumed that the programming procedure is to make the first unit element 5a transit to the ON state, and to make the first wiring 71 and a second wiring 72 conducted each other. That is, it is assumed that the first unit element 5a is in the OFF state initially.

As the bias condition, a high voltage with the positive polarity, which is higher than the set voltage, is applied to the source of the first transistor 61. Moreover, a low voltage is applied to the second wiring 72. In the case that the first transistor 61 is turned on, the high voltage is applied to the first wiring 71. According to this bias condition, the first switch 1 enters into the state of reverse bias, and consequently maintains the OFF state, but the second switch 2 transits to the ON state since the second switch 2 enters into the forward bias.

Next, while the first switch 1 of the first unit element 5a is in the OFF state and the second switch 2 is in the ON state, a low voltage is applied to the source of the first transistor 61. In the case that the first transistor 61 is turned on, the low voltage is applied to the first wiring 71. Moreover, a high voltage with the positive polarity, which is lower than the set voltage, is applied to the second wiring 72.

According to the bias condition, the first switch 1 transits to the ON state since the first switch enters into the state of forward bias. On the other hand, the second switch 2 maintains the ON state. Accordingly, each of the first switch 1 and the second switch 2 enters into the ON state, and consequently the first wiring 71 and the second wiring 72 are conducted each other via the first unit element 5a. After the first unit element 5a is conducted, the first wiring 71 is separated from the power supply through turning off the first transistor 61. Accordingly, it is possible to carry out signal transmission between the first wiring 71 and the second wiring 72 with no influence due to the power supply or the like, and consequently reliability of the signal transmission is improved.

Third Exemplary Embodiment

Figure 6B:
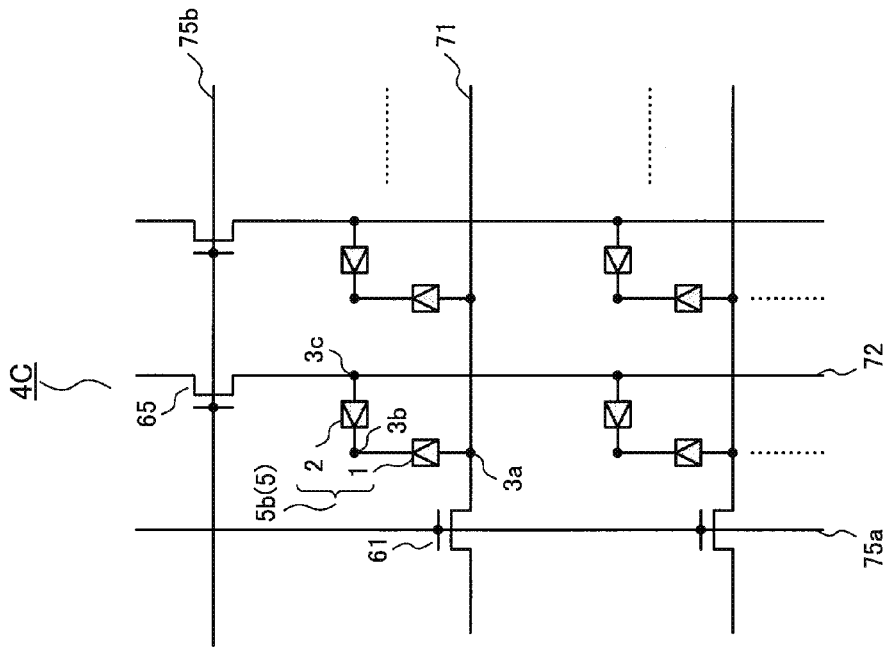
FIG. 6B shows composition of a semiconductor device, which uses a second unit element, according to the third exemplary embodiment of the present invention.
Figure 6A:
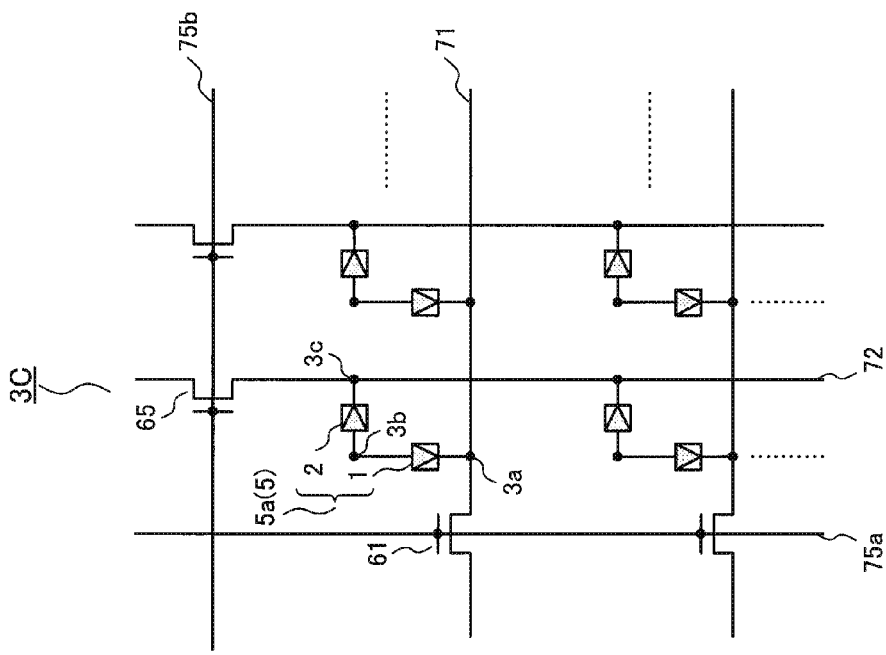
FIG. 6A shows composition of a semiconductor device, which uses a first unit element, according to a third exemplary embodiment of the present invention.

Next, a third exemplary embodiment according to the present invention will be described. Here, the same composition as one according to the second exemplary embodiment has the same code as one according to the second exemplary embodiment, and description on the same composition is omitted appropriately. FIGS. 6A and 6B shows composition of semiconductor devices 3C and 4C. Particularly, FIG. 6A shows composition of the semiconductor device 3C which uses the first unit element 5a, and FIG. 6B shows composition of the semiconductor device 4C which uses the second unit element 5b.

In addition to the composition according to the second exemplary embodiment, a plurality of second transistors 65 (power supply connection control transistor 65) each of which is connected with a second wiring 72, and a plurality of second control lines 75b through each of which the second transistor 65 is controlled. That is, according to the second exemplary embodiment, a connection between the first wiring 71 and a power supply is controlled through making the first transistor 61 turned on and off. Furthermore, according to the second exemplary embodiment, a connection between the second wiring 72 and the power supply is controlled through making the second transistor 65 turned on and off.

The drain of the first transistor 61 is connected with the first wiring 71, and a low voltage (or high voltage) is applied to the source of the first transistor 61. Moreover, a drain of the second transistor 65 is connected with the second wiring 72, and a high voltage (or low voltage) is applied to a source of the second transistor 65.

An operation of the above-mentioned semiconductor devices 3C and 4C will be described. Here, since a programming procedure of the semiconductor device 4C is almost the same as one of the semiconductor device 3C, only the programming procedure of the semiconductor device 3C will be exemplified in the following. The programming procedure to conduct the first wiring and the second wiring 72 each other in order to transmit a signal will be explained in the following. That is, it is assumed that the first unit element 5a is in the OFF state initially.

Firstly, a low voltage is applied to the source of the first transistor 61, and a high voltage with the positive polarity, which is higher than the set voltage, is applied to the source of the second transistor 65. Then, the first transistor 61 and the second transistor 65 are turned on.

According to this bias condition, the first switch 1 enters into the state of forward bias, and consequently transits to the ON state, but the second switch 2 maintains the OFF state since the second switch 2 enters into the state of reverse bias.

Next, the first transistor 61 and the second transistor 65 are turned off, and a high voltage with the positive polarity which is higher than the set voltage is applied to the source of the first transistor 61, and a low voltage is applied to the source of the second transistor 65. Afterward, the first transistor 61 and the second transistor 65 are turned on.

According to this bias condition, the second switch 2 transits to the ON state since the second switch 2 enters into the state of forward bias. Accordingly, each of the first switch 1 and the second switch 2 enters into the ON state, and consequently the first wiring 71 and the second wiring 72 are conducted each other via the first unit element 5a.

After the first unit device 5a is conducted, the first transistor 61 and the second transistor 65 are turned off. As a result, the first wiring 71 and the second wiring 72 are separated from the power supply or the like. Accordingly, it is possible to carry out signal transmission between the first wiring 71 and the second wiring 72 with no influence due to the power supply or the like.

As mentioned above, the high voltage or the low voltage is applied to the first wiring 71 and the second wiring 72 only at a time of programming for the unit element, it is possible to prevent an influence, which is due to the forming voltage, from being caused to a sending portion or a receiving portion of a transmission signal. Hereinafter, the sending portion or the receiving portion of the transmission signal is abbreviated as a signal unit. In this case, it may be preferable that the sending portion and the receiving portion are corresponding to the first wiring 71 side and the second wiring side 72 respectively, or it may be preferable that the sending portion and the receiving portion are corresponding to the second wiring 72 side and the first wiring side 71 respectively.

Fourth Exemplary Embodiment

Figure 7A:
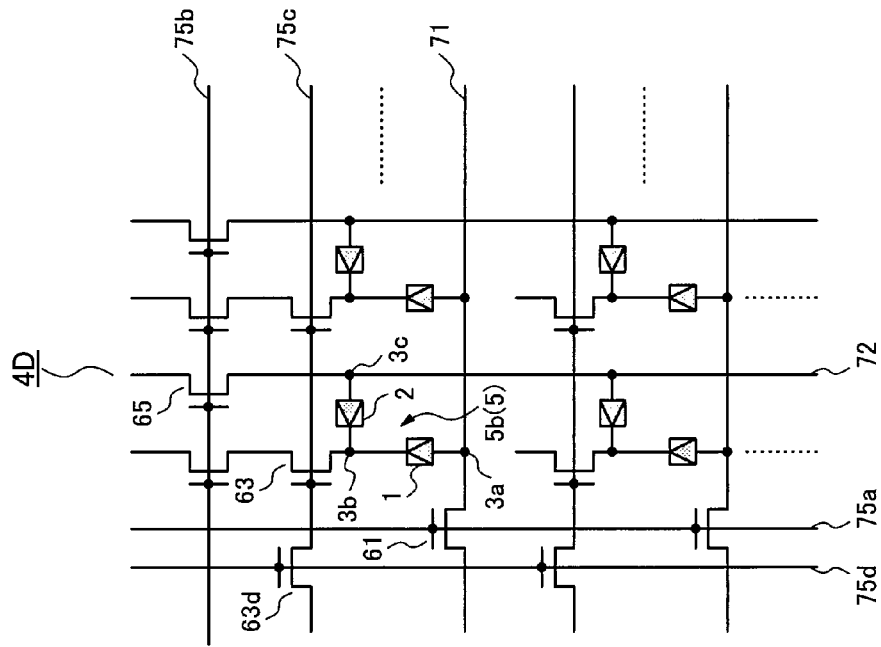
FIG. 7A shows composition of a semiconductor device, which uses a first unit element, according to a fourth exemplary embodiment of the present invention.
Figure 7B:
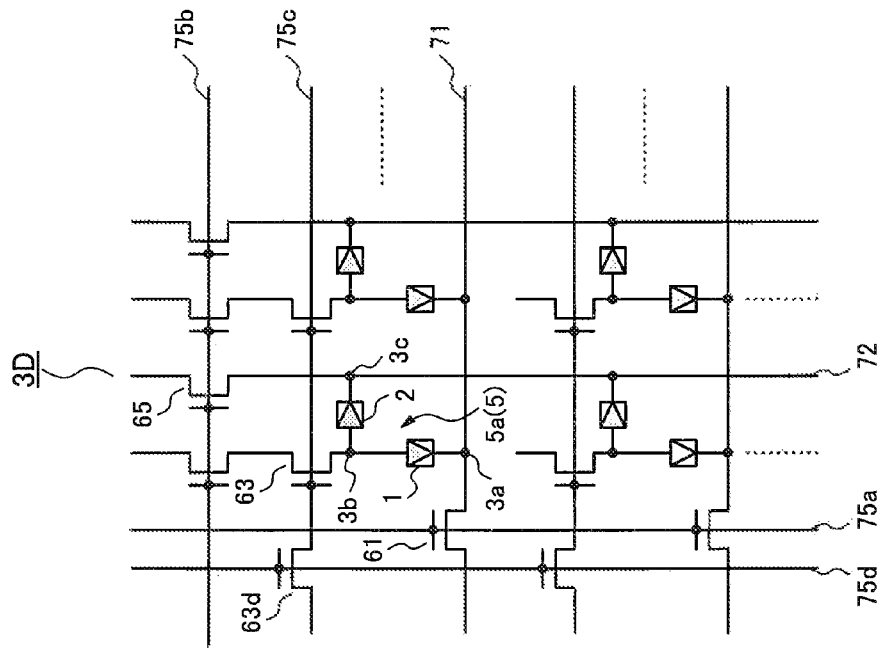
FIG. 7B shows composition of a semiconductor device, which uses a second unit element, according to the fourth exemplary embodiment of the present invention.

Next, a fourth exemplary embodiment according to the present invention will be described. Here, the same composition as one according to the third exemplary embodiment has the same code as one according to the third exemplary embodiment, and description on the same composition is omitted appropriately. FIGS. 7A and 7B shows composition of semiconductor devices 3D and 4D. Particularly, FIG. 7A shows composition of the semiconductor device 3D which uses the first unit element 5a, and FIG. 7B shows composition of the semiconductor device 4D which uses the second unit element 5b.

In addition to the composition according to the third exemplary embodiment, a voltage of the common node 3b of an unit element 5 is controlled according to the fourth exemplary embodiment. Therefore, a plurality of third transistors 63 (common node electrical potential control transistor 63) and a plurality of third control lines 75c are arranged according to the fourth exemplary embodiment in addition to the composition according to the third exemplary embodiment. Moreover, a plurality of fourth transistors 63d each of which controls applying a control signal to the third control line 75c, and a plurality of fourth control lines 75d through each of which the fourth transistor 63d is controlled.

Moreover, a gate of the third transistor 63 is connected with the third control line 75c. Moreover, a drain of the third transistor 63 is connected with the common node 3b, and a high voltage (or low voltage) is applied to a source of the third transistor 63.

An operation of the above-mentioned semiconductor devices 3D and 4D will be described. Here, since a programming procedure of the semiconductor device 4D is almost the same as one of the semiconductor device 3D, only the programming procedure of the semiconductor device 3D will be exemplified in the following. The programming procedure to conduct the first wiring 71 and the second wiring 72 each other in order to transmit a signal will be explained in the following. That is, it is assumed that the first unit element 5a is in the OFF state initially.

Figure 8:
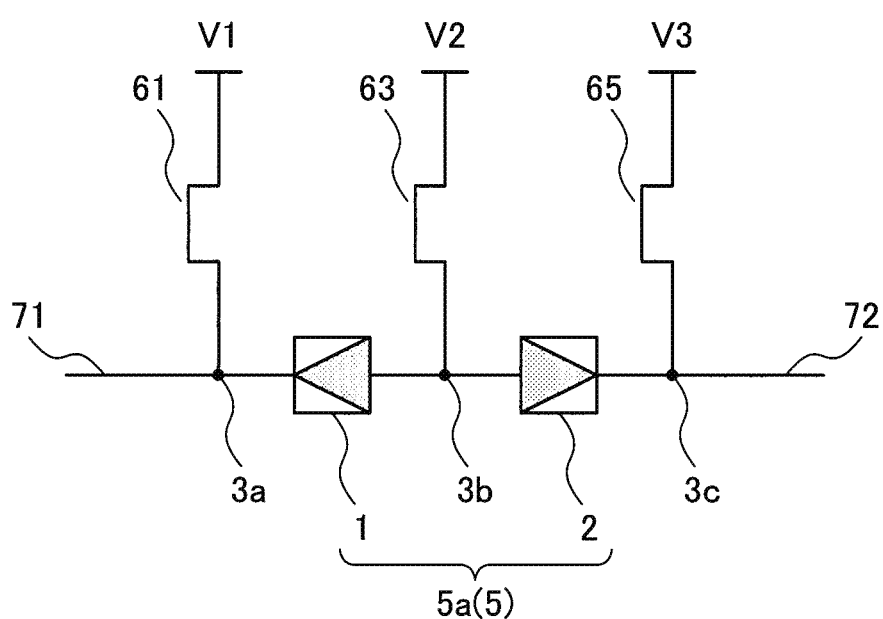
FIG. 8 shows main components which are extracted from the semiconductor device according to the fourth exemplary embodiment.

FIG. 8 shows main components which are extracted from the semiconductor device 3D shown in FIG. 7. Here, V1 terminal to V3 terminal in FIG. 8 indicate terminals of the first transistor 61, the second transistor 65 and the third transistor 63 respectively. Accordingly, in the case that each the transistor is turned on, a voltage of the first node 3a which is connected with the first wiring 71 is coincident with a voltage of the V1 terminal, and a voltage of the common node 3b is coincident with a voltage of the terminal V2, and a voltage of the second node 3c which is connected with the second wiring 72 is coincident with a voltage of the V3 terminal.

As the bias condition, the voltages of the first node 3a and the second node 3c are set to low voltages respectively. Moreover, the voltage of the common node 3b is set to a high voltage with the positive polarity which is higher than the set voltage.

When programming, the first transistor 61, the second transistor 65 and the third transistor 63 are turned on. As a result, each of the first switch 1 and the second switch 2 enters into the state of forward bias and transits to the ON state. Accordingly, the first wiring 71 and the second wiring 72 are conducted each other via the first unit element 5a. After the conduction, it is possible to carry out signal transmission between the first wiring 71 and the second wiring 72 through turning off the first transistor 61, the second transistor 65 and the third transistor 63.

On the other hand, in the case of disconnecting the first wiring 71 and the second wiring 72 each other, a low voltage is applied to the common node 3b, and high voltages with the positive polarity which are higher than the reset voltage are applied to the first node 3a and the second node 3c respectively. As a result, each of the first switch 1 and the second switch 2 enters into the state of reverse bias, and then transits to the OFF state. Accordingly, the first wiring 71 and the second wiring 72 are not conducted each other.

As mentioned above, since the states of electrical resistance of the first switch 1 and the second switch 2 can be changed simultaneously, there is an advantage that it is possible to carry out the programming with ease. Accordingly, number of programming mistakes or the like is decreased, and consequently reliability of the semiconductor device is improved.

Moreover, it is possible to form a crossbar switch with ease through arranging quite densely the unit elements each of which has the above-mentioned composition. Furthermore, it is possible to produce the crossbar switch, which has a feature of the low power consumption and the high reliability, since the unit element does not carry out the false work even if the forming voltage of this unit element is set to be low. Moreover, since it is easy to mount the crossbar switch on the semiconductor device such as FPGA, it is possible to realize the low power consumption and the high reliability of the semiconductor device.

Furthermore, in the case that a switch part of the crossbar switch is arranged within the multi-layered wiring layers, it is possible to reduce a charging or discharging current, which flows at a time of the signal transmission, since an area occupied by the switch part is small. Also from this point of view, it is possible to reduce the consumption power.

Fifth Exemplary Embodiment

Figure 9A:
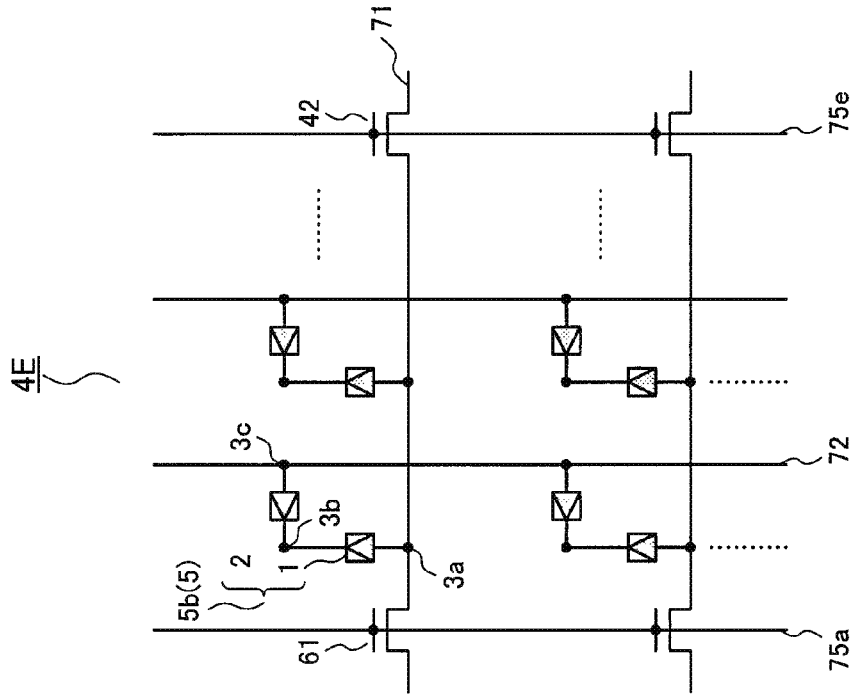
FIG. 9A shows composition of a semiconductor device, which uses a first unit element, according to a fifth exemplary embodiment of the present invention.
Figure 9B:
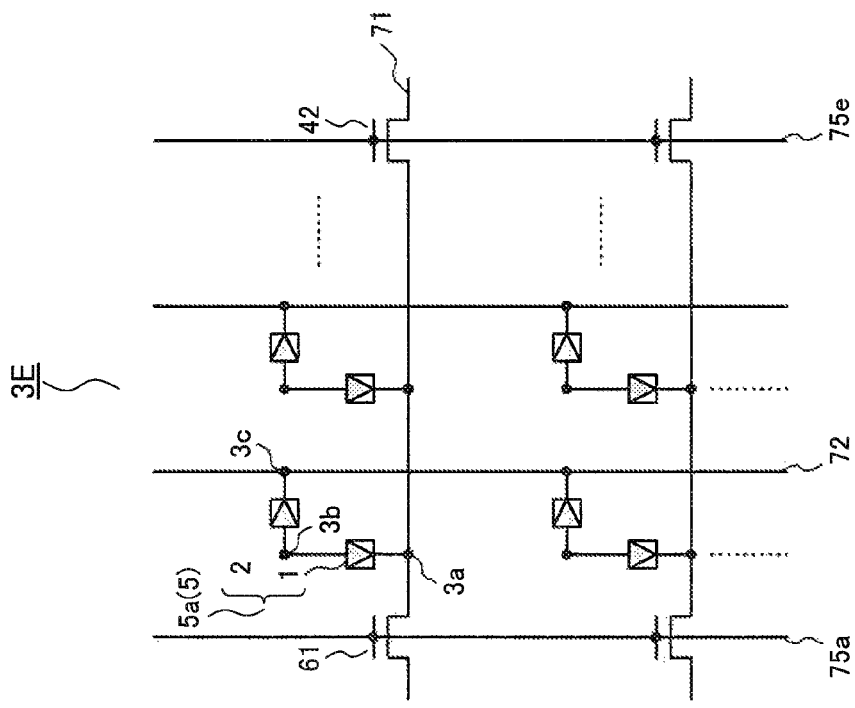
FIG. 9B shows composition of a semiconductor device, which uses a second unit element, according to the fifth exemplary embodiment of the present invention.

Next, a fifth exemplary embodiment according to the present invention will be described. Here, the same composition as one according to the third exemplary embodiment has the same code as one according to the third exemplary embodiment, and description on the same composition is omitted appropriately. FIGS. 9A and 9B shows composition of semiconductor devices 3E and 4E. Particularly, FIG. 9A shows composition of the semiconductor device 3E which uses the first unit element 5a, and FIG. 9B shows composition of the semiconductor device 4E which uses the second unit element 5b.

According to the second exemplary embodiment described above, the first transistor 61 is arranged so that the power supply which supplies a voltage to the first wiring, and the first wiring may be separated each other when programming for the unit element 5.

In contrast, according to the exemplary embodiment, in order to separate the power supply from the signal unit at a time of programming, a fifth transistor 42 (signal unit connection control transistor 42) is arranged additionally so as to interpose the first unit element 5a. Moreover, a fifth control line 75e, through which the fifth transistor 42 is controlled, is arranged additionally.

It is preferable that, if a P type MIS transistor (Metal Insulator Semiconductor transistor) is applied to the first transistor 61, the fifth transistor 42 is a N type MIS transistor. Apparently, it may be preferable that, if a N type MIS transistor (Metal Insulator Semiconductor transistor) is applied to the first transistor 61, the fifth transistor 42 is a P type MIS transistor. As the MIS transistor, a MOS transistor (Metal Oxide Semiconductor transistor) is applicable.

In the case that different type transistors are used like a P type MIS transistor and a N type MIS transistor are applied to the first transistor 61 and the fifth transistor 42 respectively, it is possible to control a state of connection between the power supply which is connected with the first wiring 71, and the signal unit not only at a time of the programming but also at the time of the signal transmission only through applying the same control signal to the first control line 75a and the fifth control line 75e In this case, since the first control line 75a and the fifth control line 75e can be used commonly, there is an advantage that it is possible to simplify a production process. It is assumed in the following description that the gate of the first transistor 61 is connected with the first control line 75a, and a gate of the fifth transistor 42 is connected with the fifth control line 75e, and the first control line 75a and the fifth control line 75e are used commonly.

The drain of the first transistor 61 and a source of the fifth transistor 42 are connected with the first node 3a. Moreover; a high voltage (or low voltage) is applied to the source of the first transistor 61. In this case, a drain of the fifth transistor 42 is connected with the signal unit.

An operation of the semiconductor devices 3E and 4E mentioned above will be described. Here, since a programming procedure of the semiconductor device 4E is almost the same as one of the semiconductor device 3E, only the programming procedure of the semiconductor device 3E will be exemplified in the following. The programming procedure to conduct the first wiring 71 and the second wiring 72 each other in order to transmit a signal will be explained in the following. That is, it is assumed that the first unit element 5a is in the OFF state initially.

A control signal which makes the fifth transistor 42 turned off is applied to the fifth control line 75e, and a control signal which makes the first transistor 61 turned on is applied to the first control line 75a. As a result, the first wiring 71 is separated from the signal unit and a high voltage (or low voltage) with the positive polarity, which is higher than the set voltage, is applied to the first wiring 71. Moreover, the second wiring 72 is separated from the signal unit and a low voltage (or high voltage) is applied to the second wiring 72.

By the bias condition mentioned above, the first switch 1 enters into the state of reverse bias, and consequently maintains the OFF state. Meanwhile, since the second switch enters into the state of forward bias, the second switch 2 transits to the ON state.

Next, in the first unit element 5a whose second switch 2 is in the ON state, a low voltage is applied to the source of the first transistor 61 to set a voltage, which is applied to the first wiring 71, to be low. Moreover, a voltage with the positive polarity, which is lower than the set voltage, is applied to the second wiring 72.

According to this bias condition, since the first switch 1 enters into the state of forward bias, the first switch 1 transits to the ON state. Meanwhile, the second switch 2 maintains the ON state. Accordingly, both of the first switch 1 and the second switch 2 enter into the ON state respectively, and consequently the first wiring 71 and the second wiring 72 are conducted each other via the first unit element 5a. After the first unit element 5a is conducted, the first wiring 71 is separated from the power supply and is connected with the signal unit through turning off the first transistor 61 and turning on the fifth transistor 42. Accordingly, the signal unit does not receive any influence from the power supply since the power supply and the signal unit are disconnected each other with no relation to being or not being at the time of programming.

Sixth Exemplary Embodiment

Figure 10A:
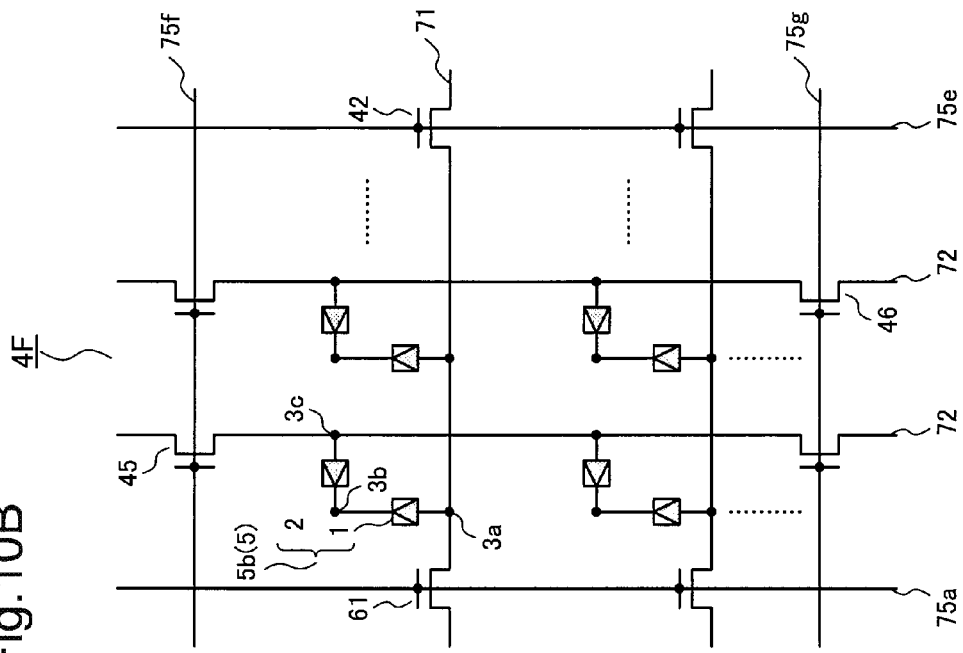
FIG. 10A shows composition of a semiconductor device, which uses a first unit element, according to a sixth exemplary embodiment of the present invention.
Figure 10B:
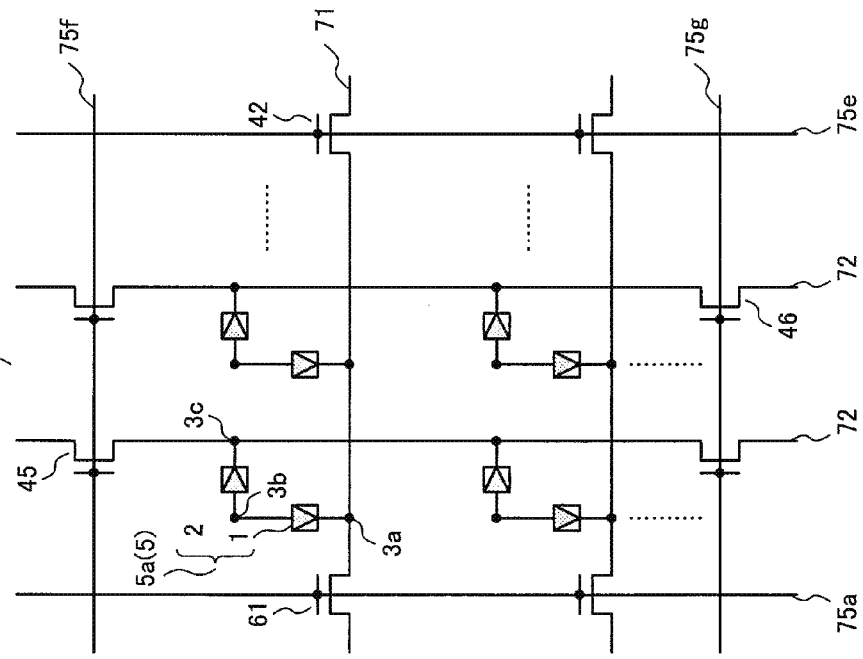
FIG. 10B shows composition of a semiconductor device, which uses a second unit element, according to the fifth exemplary embodiment of the present invention.

Next, a sixth exemplary embodiment of the present invention will be described. Here, the same composition as one according to the fifth exemplary embodiment has the same code as one according to the fifth exemplary embodiment, and description on the same composition is omitted appropriately. FIGS. 10A and 10B shows composition of semiconductor devices 3F and 4F. Particularly, FIG. 10A shows composition of the semiconductor device 3F which uses the first unit element 5a, and FIG. 10B shows composition of the semiconductor device 4F which uses the second unit element 5b.

According to the fifth exemplary embodiment, the first transistor 61 and the fifth transistor 42 are arranged at both ends of the first wiring 71 respectively so that the power supply and the signal unit may be disconnected each other with no relation to being or not being at the time of programming. In contrast, according to the sixth exemplary embodiment, it is possible that a signal unit and a power supply, which are connected with the second wiring 72, are disconnected each other.

Therefore, each of the semiconductor devices 3F and 3E according to the sixth exemplary embodiment includes a sixth transistor 45 (power supply connection control transistor 45), a seventh transistor 46 (signal unit connection control transistor 46), a sixth control line 75f and a seventh control line 75g in addition to the composition of the semiconductor devices 3E and 4E according to the fifth exemplary embodiment. It is assumed that the sixth transistor 45 is a P type MIS transistor, and the seventh transistor 46 is a N type MIS transistor. Moreover, a gate of the sixth transistor 45 is connected with the sixth control line 75f, and a gate of the seventh transistor 46 is connected with the seventh control line 75g. As described above, since it is possible to apply a common control signal to the sixth control line 75f and the seventh control line 75g in the case that a N type is applied to the seventh transistor 46 when a P type is applied to the sixth transistor 45, it is possible to use the seventh control line 75g and the sixth control line 75f commonly.

Moreover, the drain of the fifth transistor 42 and a source of the sixth transistor 45 are connected with the first node 3a. A high voltage (or low voltage) is applied to the source of the first transistor 61. In this case, a drain of the sixth transistor 45 is connected with the signal unit. Moreover, the drain of the sixth transistor 45 and a source of the seventh transistor 46 are connected with the second node 3c. A low voltage (or high voltage) is applied to the source of the sixth transistor 45. In this case, a drain of the seventh transistor 46 is connected with the signal unit.

An operation of the semiconductor device 3F and 4F mentioned above will be described. Here, since a programming procedure of the semiconductor device 4F is almost the same as one of the semiconductor device 3F, only the programming procedure of the semiconductor device 3F will be exemplified in the following. The programming procedure to conduct the first wiring 71 and the second wiring 72 each other in order to transmit a signal will be explained in the following. That is, it is assumed that the first unit element 5a is in the OFF state initially.

A control signal which makes the fifth transistor 42 turned off is applied to the fifth control line 75e, and a control signal which makes the seventh transistor 46 turned off is applied to the seventh control line 75g. As a result, the signal unit is separated from the first node 3a and the second node 3c. In this state, a high voltage with the positive polarity, which is higher than the set voltage, is applied to the source of the first transistor 61, and a low voltage is applied to the source of the sixth transistor 45. Afterward, the first transistor 61 and the sixth transistor 45 are turned on.

By the bias condition mentioned above, the first switch 1 enters into the state of reverse bias, and consequently maintains the OFF state. Meanwhile, the second switch 2 enters into the state of forward bias, and consequently transits to the ON state.

Next, in the first unit element 5a whose first switch 1 is in the OFF state and whose second switch 2 is in the ON state, a low voltage is applied to the source of the first transistor 61 and a high voltage with the positive polarity, which is higher than the set voltage, is applied to the source of the sixth transistor 45.

According to this bias condition, since the first switch 1 enters into the state of forward bias, the first switch 1 transits to the ON state. Meanwhile, the second switch 2 maintains the ON state. Accordingly, both of the first switch 1 and the second switch 2 enter into the ON state respectively, and consequently the first wiring 71 and the second wiring 72 are conducted each other via the first unit element 5a. After the first unit element 5a is conducted, the first transistor 61 is turned off, and the fifth transistor 42 is turned on, and the sixth transistor 45 is turned off, and the seventh transistor 46 is turned on. As a result, the first wiring 71 and the second wiring 72 are separated from the power supplies respectively and are connected with the signal units respectively. Accordingly, it is possible that the signal unit is disconnected always with the power supply.

Seventh Exemplary Embodiment

Figure 11A:
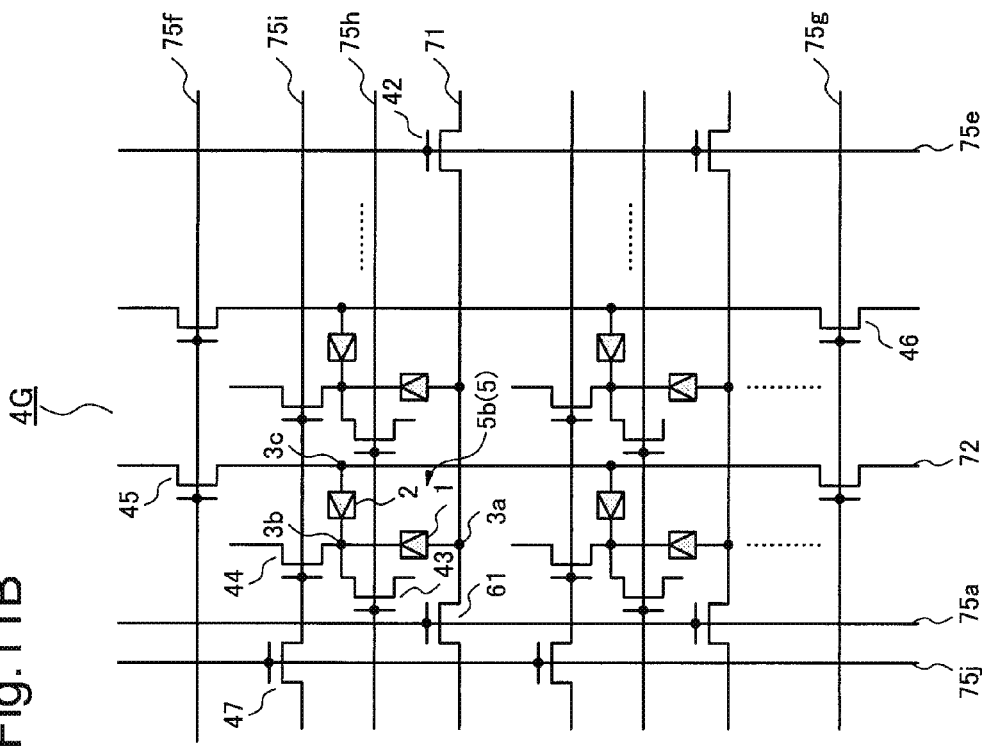
FIG. 11A shows composition of a semiconductor device, which uses a first unit element, according to a seventh exemplary embodiment of the present invention.
Figure 11B:
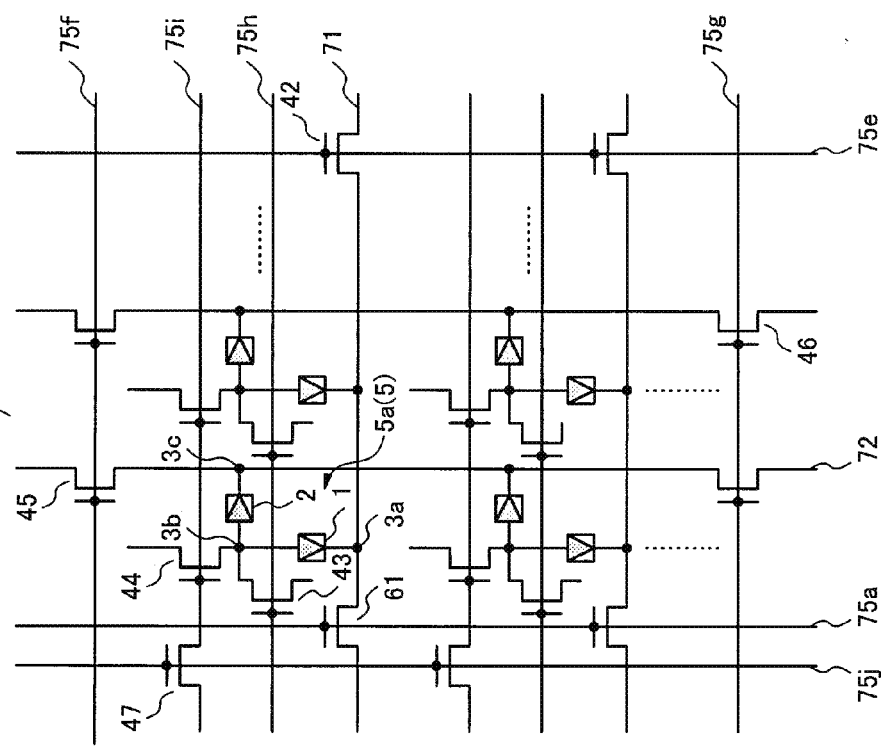
FIG. 11B shows composition of a semiconductor device, which uses a second unit element, according to the seventh exemplary embodiment of the present invention.

Next, a seventh exemplary embodiment according to the present invention will be described. Here, the same composition as one according to the sixth exemplary embodiment has the same code as one according to the sixth exemplary embodiment, and description on the same composition is omitted appropriately. FIGS. 11A and 11B shows composition of semiconductor devices 3G and 4G. Particularly, FIG. 11A shows composition of the semiconductor device 3G which uses the first unit element 5a, and FIG. 11B shows composition of the semiconductor device 4G which uses the second unit element 5b.

According to the sixth exemplary embodiment, the first transistor 61, the fifth transistor 42 to the seventh transistor 46, or the like are arranged so that the power supplies may not cause the influence on the signal units, which are connected with the first wiring 71 and the second wiring 72 respectively, at a time of programming for the unit element. In addition to the composition of the semiconductor device according to the sixth exemplary embodiment, the semiconductor device according to the seventh exemplary embodiment has composition that an electrical potential of the common node 3b can be controlled.

That is, in addition to the composition according to the sixth exemplary embodiment, composition according to the seventh exemplary embodiment includes a plurality of eighth transistors 43 (common node electrical potential control transistor 43), a plurality of ninth transistors 44 (common node electrical potential control transistor 44), a plurality of eighth control lines 75h and a plurality of ninth control lines 75i. Moreover, a plurality of tenth transistors 47 each of which controls applying a control signal to the ninth control line 75i, and a plurality of tenth control lines 75j, through each of which the tenth transistor 47 is controlled, are arranged.

The eighth control line 75h is connected with a gate of the eighth transistor 43, and the ninth control line 75i is connected with a gate of the ninth transistor 44. As described above, since it is possible to apply the same control signal to the eighth control line 75h and the ninth control line 75i through applying a N type MIS transistor to the ninth transistor 44 in the case that a P type MIS transistor is applied to the eighth transistor 43.

Drains of the eighth transistor 43 and the ninth transistor 44 are connected with the common node 3b, and a high voltage is applied to a source of the eighth transistor 43, and a low voltage is applied to a source of the ninth transistor 44.

An operation of the semiconductor devices 3G and 4G mentioned above will be described. Here, since a programming procedure of the semiconductor device 4G is almost the same as one of the semiconductor device 3G, only the programming procedure of the semiconductor device 3G will be exemplified in the following.

The programming procedure to conduct the first wiring 71 and the second wiring 72 each other in order to transmit a signal will be explained in the following. That is, it is assumed that the first unit element 5a is in the OFF state initially.

Figure 12:
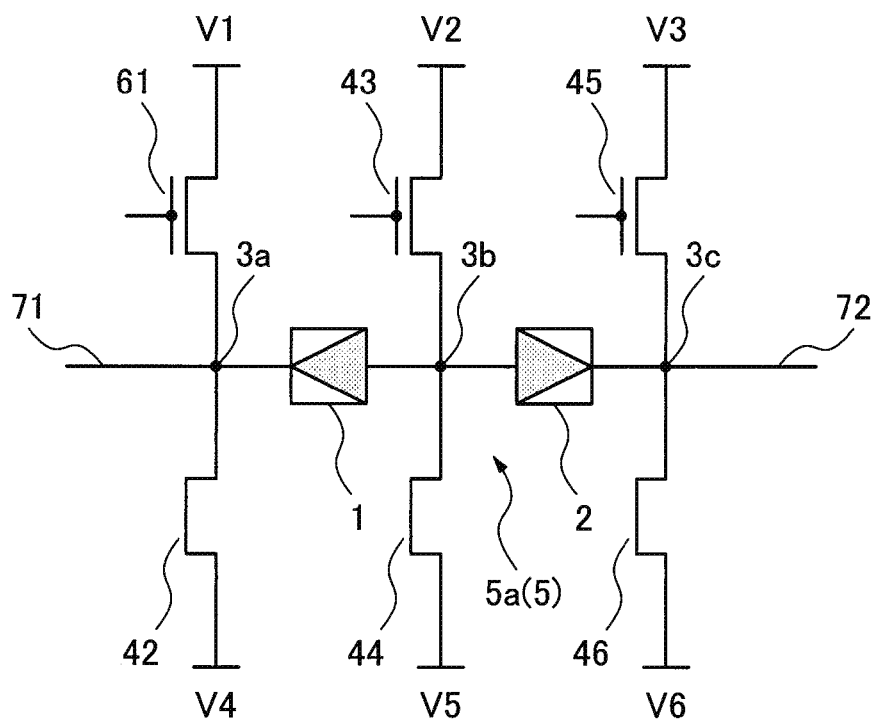
FIG. 12 shows main components which are extracted from the semiconductor device according to the seventh exemplary embodiment.

FIG. 12 shows main components which are extracted from the semiconductor device 3G. It is assumed in FIG. 12 that a high voltage (or low voltage) is applied to a terminal V1 of the first transistor 61, and a low voltage (or high voltage) is applied to a terminal V3 of the sixth transistor 45. Moreover, it is assumed that a high voltage (or low voltage) is applied to a terminal V2 of the eighth transistor 43, and a low voltage (or high voltage) is applied to a terminal V5 of the ninth transistor 44. Moreover, it is assumed that a terminal V4 of the fifth transistor 42 and a terminal V6 of the seventh transistor 46 are connected with signal units respectively.

On these assumptions, a control signal is applied to each the control line so as to make the first transistor 61 and the fifth transistor 42 enter into the states different each other out of the ON state and the OFF state, and so as to make the eighth transistor 43 and the ninth transistor 44 enter into the states different each other, and so as to make the sixth transistor 45 and the seventh transistor 46 enter into the states different each other. For example, in the case that the first transistor 61 is turned on, the fifth transistor 42 is turned off.

The first unit device 5a is programmed so that the first unit element 5a may be set to the ON state. At this time, it is assumed that low voltages are applied to the terminal V1 of the first transistor 61 and the terminal V3 of the sixth transistor 45 respectively. On the bias condition mentioned above, the fifth transistor 42, the seventh transistor 46 and the ninth transistor 44 are turned off, and the first transistor 61, the eighth transistor 43 and the sixth transistor 45 are turned on. As a result, the first node 3a and the second node 3c are separated from the signal unit and a low voltage is applied to the first node 3a and the second node 3c. Moreover, a high voltage is applied to the common node 3b.

Accordingly, each of the first switch 1 and the second switch 2 enters into the state of forward bias, and consequently transits to the ON state. Therefore, the first wiring 71 and the second wiring 72 are conducted each other via the first unit device 5a. After the conduction, the first transistor 61 the fifth transistor 42 and the seventh transistor 46 are turned on, and the first transistor 61, the eighth transistor 43, the sixth transistor 45 and the ninth transistor 44 are turned off. As a result, the first node 3a, the second node 3c and the common node 3b are separated from the power supply, and the first node 3a and the second node 3c are connected with the signal unit, and consequently it is possible to carry out signal transmission.

On the other hand, in the case of disconnecting the first wiring 71 and the second wiring 72 each other (in the case of programming so that the first unit element 5a may be set to the OFF state), a high voltage is applied to the terminal V1 of the first transistor 61 and the terminal V3 of the sixth transistor 45. Then, the fifth transistor 42, the seventh transistor 46 and the eighth transistor 43 are turned off, and the first transistor 61, the sixth transistor 45 and the ninth transistor 44 are turned on.

As a result, the first node 3a and the second node 3c are separated from the signal unit, and a high voltage is applied to the first node 3a and the second node 3c. Moreover, a low voltage is applied to the common node 3b. Accordingly, each of the first switch 1 and the second switch 2 enters into the state of reverse bias, and consequently transits to the OFF state. Therefore, the first wiring 71 and the second wiring 72 are disconnected each other. Afterward, the fifth transistor 42 and the seventh transistor 46 are turned on, and the first transistor 61, the sixth transistor 45, the eighth transistor 43 and the ninth transistor 44 are turned off. By the above-mentioned operation, it is possible to control the conduction between the first wiring 71 and the second wiring 72. Accordingly, the signal unit is separated always from the power supply, and it is possible to carry out the programming for the unit element by one process. As a result, it is possible to carry out the programming process with ease and with accuracy.

Here, there is a fear that the first switch 1 or the second switch 2 may carry out a false work due to a noise or the like when the first wiring 71 and the second wiring 72 are disconnected each other. However, there is no case, as described above, that the first switch 1 and the second switch 2 transit to the ON state simultaneously even if the first switch 1 or the second switch 2 carries out the false work. As a result, the first unit element 5a maintains the OFF state. Accordingly, it is possible to prevent (OFF disturbance). Therefore, by virtue of the composition, it is possible to prevent the false work of the semiconductor device, and consequently reliability of the semiconductor device is improved remarkably.

Eighth Exemplary Embodiment

Figures 13A, 13B:
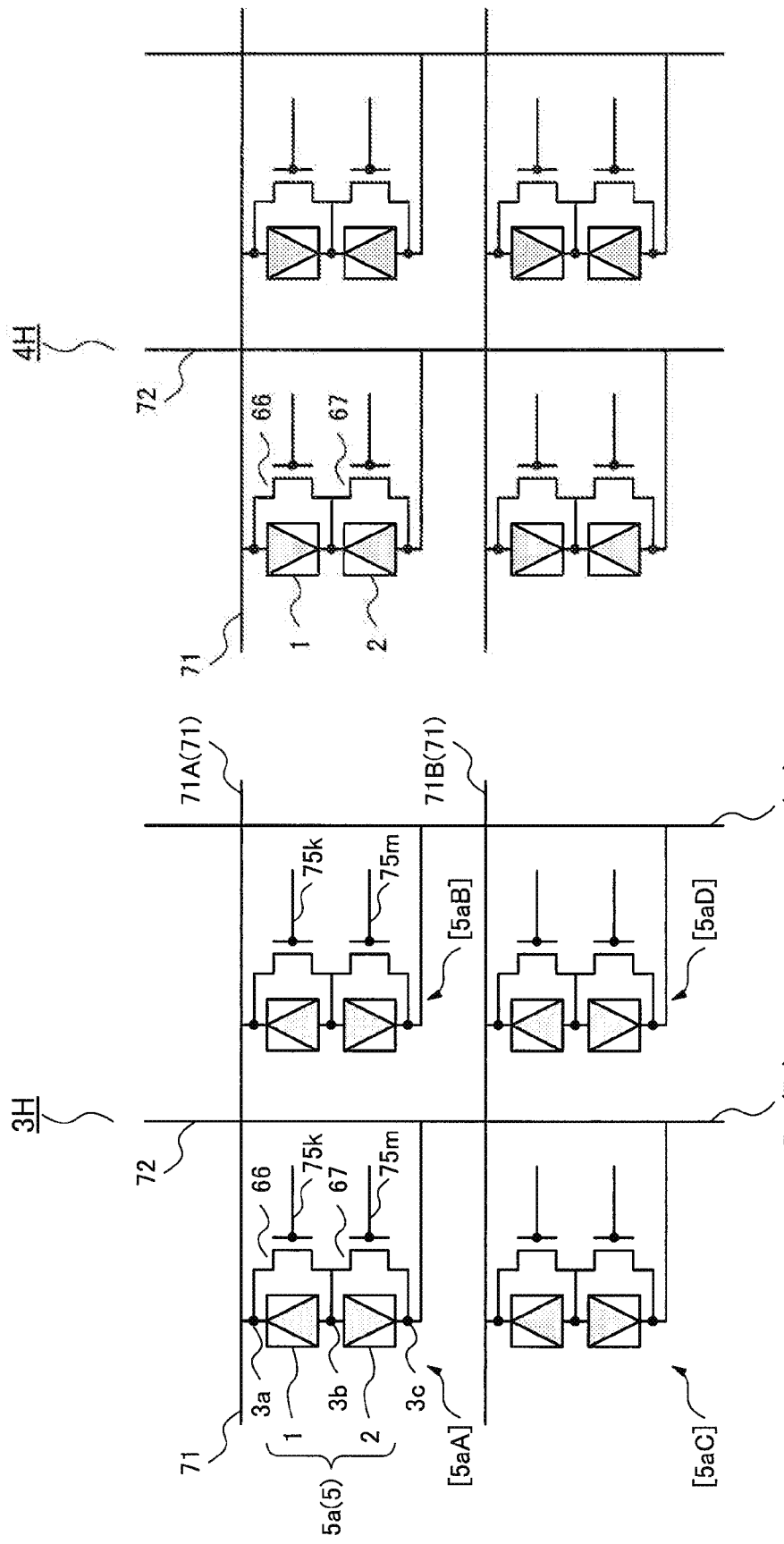
FIG. 13A shows composition of a semiconductor device, which uses a first unit element, according to an eighth exemplary embodiment of the present invention.
FIG. 13B shows composition of a semiconductor device, which uses a second unit element, according to the eighth exemplary embodiment of the present invention.
Figure 14A:
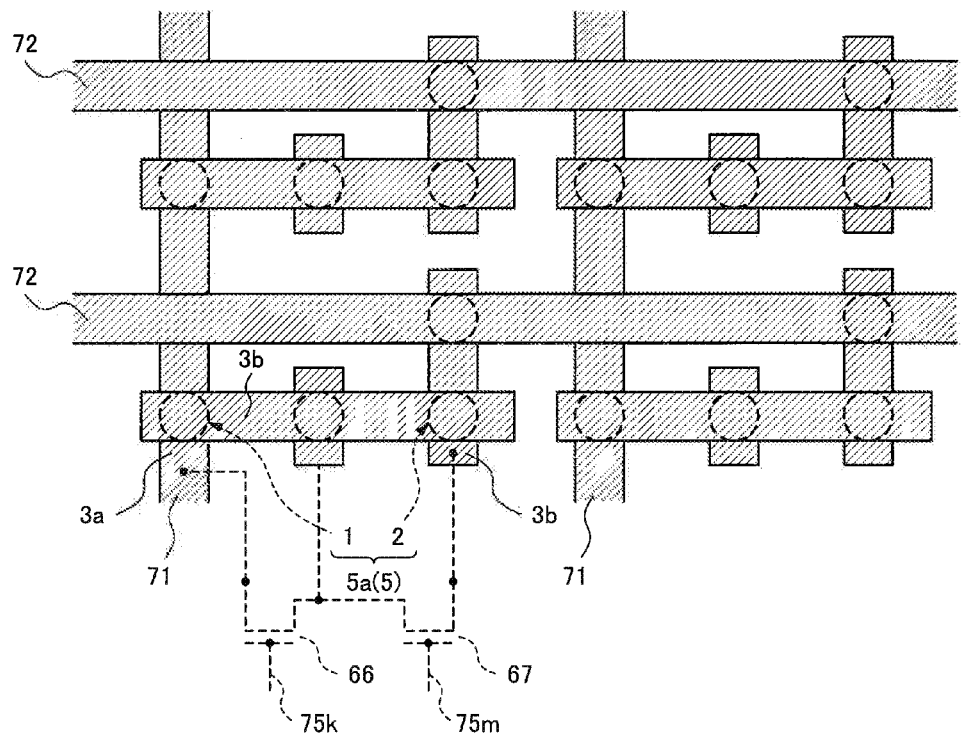
FIG. 14A is a wiring layout diagram of the semiconductor device according to the eighth exemplary embodiment.
Figure 14B:
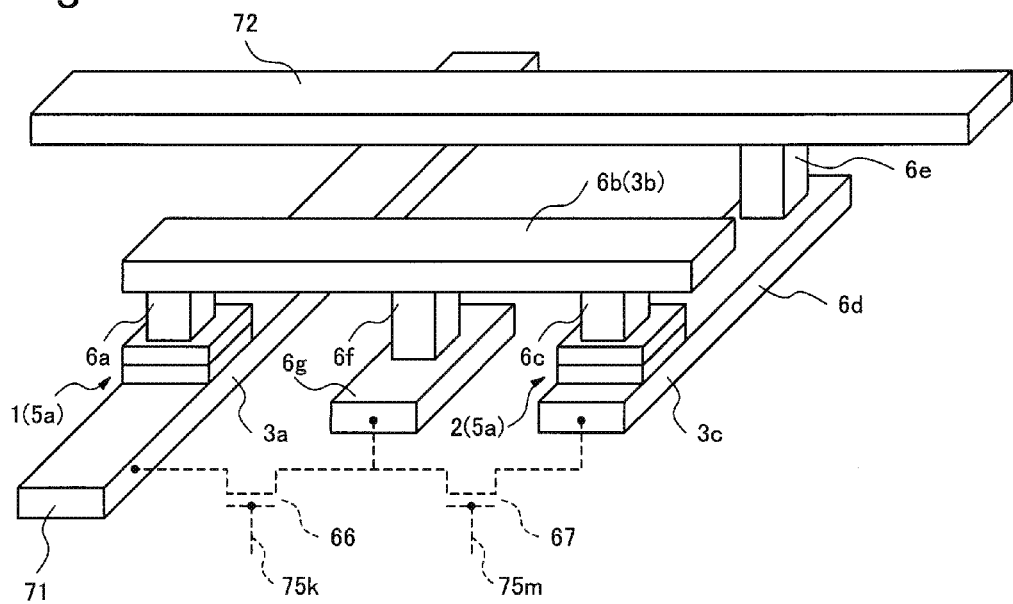
FIG. 14B is a perspective view of the wiring and the first unit element of the semiconductor device according to the eighth exemplary embodiment.
Figure 15:
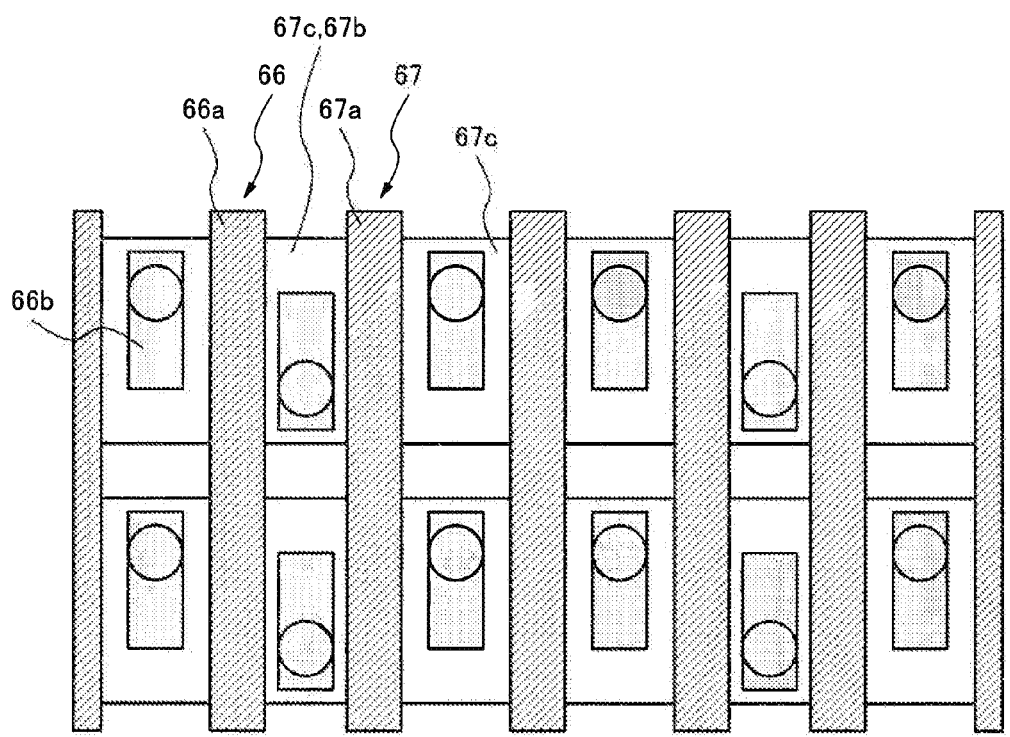
FIG. 15 is a transistor layout diagram according to the eighth exemplary embodiment.

Next, an eighth exemplary embodiment according to the present invention will be described. Here, the same composition as one according to the first exemplary embodiment has the same code as one according to the first exemplary embodiment, and description on the same composition is omitted appropriately. FIGS. 13A and 13B shows composition of semiconductor devices 3H and 4H. Particularly, FIG. 13A shows composition of the semiconductor device 3H which uses the first unit element 5a, and FIG. 13B shows composition of the semiconductor device 4H which uses the second unit element 5b. Moreover, FIGS. 14A and 14B shows structure of a wiring pattern of the semiconductor device 3H. Particularly, FIG. 14A is a layout diagram of wirings and FIG. 14B is a perspective view of the wirings and the first unit element. Moreover, FIG. 15 is a layout diagram of transistors. In FIG. 14 or the like, an inter-layer insulation film or the like is omitted. Here, as an additional remark, the structure shown in FIG. 14 and FIG. 15 is merely exemplified since it is possible to conceive various structure of the layout or the like.

According to the exemplary embodiment, it is possible to make the first switch 1 and the second switch 2, which the unit element 5 includes, short-circuited temporarily. Therefore, a plurality of eleventh transistors 66, a plurality of twelfth transistors 67, a plurality of eleventh control lines 75k and a plurality of twelfth control lines 75m are arranged in addition to the composition of the semiconductor devices 3A and 4A according to the first exemplary embodiment. Here, the eleventh transistor 66 (bypass transistor 66), the twelfth transistor 67 (bypass transistor 67), the eleventh control line 75k and the twelfth control line 75m are indicated by an imaginary line in FIG. 14.

Moreover, a source and a drain of the eleventh transistor 66 are connected with the first node 3a and the common node 3b respectively, and a source and a drain of the twelfth transistor 67 are connected with the second node 3c and the common node 3b respectively. Moreover, a gate of the eleventh transistor 66 is connected with the eleventh control line 75k, and a gate of the twelfth transistor 67 is connected with the twelfth control line 75m. It is necessary to make each of the eleventh transistor 66 and the twelfth transistor 67 turned off except when programming for first unit element 5a.

As shown in FIG. 15, the gate 66a of the eleventh transistor 66 and the gate 67a of the twelfth transistor 67 are arranged side by side, and the drain 66c of the eleventh transistor 66 and the source 67b of the twelfth transistor 67 share one junction layer. Thus, through sharing the junction layer, an arrangement of the eleventh transistor 66 and the twelfth transistor 67 has the most dense arrangement structure, and it is possible to make a distance between the first switch 1 and the second switch 2 short. That is, it is possible to carry out high speed signal transmission. Furthermore, an area where the unit element occupies becomes small. Here, while FIG. 15 show a case that each gate electrode of the transistors 66 and 67 has a function of the control line additionally and is arranged so as to extend in a upward and downward direction in the figure, and consequently each the transistor is arranged most densely in a left and right direction, it may be preferable that each direction is different from one shown in the case. That is, it may be preferable that each the gate electrode of the transistors 66 and 67 has the function of the control line and is arranged so as to extend in the right and left direction in the figure, and consequently each the transistor is arranged most densely in the upward and downward direction.

As shown in FIG. 14B, the first switch 1 is formed on the first wiring 71, and a connection line 6b is arranged on the first switch 1 via a connection line 6a. The second switch 2 is arranged under the other end of the connection line 6b via a connection line 6c. The second electrode of the second switch 2 is connected with the second wiring 72 via a connection line 6d and a connection line 6e. The connection line 6h which is corresponding to the common node is connected with a connection line 6g via the connection line 6e. Moreover, a source terminal of the eleventh transistor 66 is connected with the first wiring, and a drain terminal of the twelfth transistor 67 is connected with the connection line 6d. Moreover, a drain terminal of the eleventh transistor 66 and a source terminal of the twelfth transistor 67 are connected with the connection line 6g.

Programming for the first unit element 5a will be described. Here, since a programming procedure of the semiconductor device 4H is almost the same as one of the semiconductor device 3H, only the programming procedure of the semiconductor device 3H will be exemplified in the following.

A high voltage with the positive polarity, which is higher than the set voltage, is applied to the first wiring 71, and a low voltage is applied to the second wiring 72. Moreover, control signals are applied to the eleventh control line 75k and the twelfth control line 75m so that the eleventh transistor 66 may be turned on and the twelfth transistor 67 may be turned off respectively.

Since the first switch 1 enters into a state of short-circuit when the eleventh transistor 66 is turned on, a voltage of the common node 3b is coincident with the voltage of the first wiring 71 which is the high voltage with the positive polarity higher than the set voltage. Meanwhile, since the twelfth transistor 67 is in the OFF state, a voltage of the second node 3c is coincident with the low voltage which is applied to the second wiring 72. Accordingly; the second switch 2 enters into the state of forward bias, and consequently transits to the ON state.

Next, a low voltage is applied to the first wiring 71, and a high voltage is applied to the second wiring 72. Then, the eleventh transistor 66 is turned off, and the twelfth transistor 67 is turned on. As a result, the second switch 2 enters into the state of short-circuit, and the high voltage is applied to the common node 3b, and the low voltage is applied to the first node 3a. Accordingly, the first switch 1 enters into the state of forward bias and consequently transits to the ON state.

By the operations mentioned above, since each of the first switch 1 and the second switch 2 transits to the ON state, the first unit element 5a enters into the ON state. Accordingly, it is possible to carry out signal transmission between the first wiring 71 and the second wiring 72.

Meanwhile, in the case of making the first unit element 5a turned off, a low voltage is applied to the first wiring 71, and a high voltage with the positive polarity, which is higher than the set voltage, is applied to the second wiring 72. Moreover, control signals are applied to the eleventh control line 75k and the twelfth control line 75m so that the eleventh transistor 66 may be turned on and the twelfth transistor 67 may be turned off respectively.

Since the first switch 1 enters into the state of short-circuit when the eleventh transistor 66 is turned on, a voltage of the common node 3b is coincident with the voltage of the first wiring 71 which is the low voltage. Since the twelfth transistor 67 is in the OFF state at this time, the high voltage which is applied to the second wiring 72 holds is applied to the second node 3c. Accordingly; the second switch 2 enters into the state of reverse bias and transits to OFF state.

Next, a high voltage is applied to the first wiring 71, and a low voltage is applied to the second wiring 72. Then, the eleventh transistor 66 is turned off and the twelfth transistor 67 is turned on. As a result, the second switch 2 enters into the state of short-circuit, and the low voltage is applied to the common node 3b and the high voltage is applied to the first node 3a. Accordingly, the first switch 1 enters into the state of reverse bias and consequently transits to OFF state.

By the operations mentioned above, each of the first switch 1 and the second switch 2 transits to the OFF state, and consequently the first unit element 5a is turned off. Accordingly, the first wiring 71 and the second wiring 72 are disconnected each other.

Here, even if the first switch 1 or the second switch 2 carries out a false work due to a noise or the like when the first unit element 5a is in the OFF state, one out of the first switch and the second switch maintains the OFF state certainly. Accordingly, it is possible to prevent the OFF disturbance. Therefore, the semiconductor device, which includes the unit element mentioned above, does not carry out the false work, and consequently it is possible to realize high reliability and low power consumption.

When making the first unit element 5a transit to the ON state, it is desirable to apply a middle-level voltage to other first wirings and second wirings. That is, FIG. 13A exemplifies four first unit elements, two first wirings and two second wirings out of a plurality of the first unit elements 5a, a plurality of the first wirings 71 and a plurality of the second wirings 72 which the semiconductor device 3H includes.

Then, these components are classified like the first unit elements 5a (5aA, 5aB, 5aC and 5aD), the first wiring 71 (71A and 71B) and the second wiring 72 (72A and 72B) as shown in FIG. 13A. Then, a case of making only the first unit device 5aA transit to the ON state is taken into consideration. At this time, the first wiring 71A and the second wiring 72A are used. That is, a high voltage is applied to the first wiring 71A, and a low voltage is applied to the second wiring 72A.

At this time, in order to make the second switch 2 of the first unit element 5aA, which is corresponding to an object for programming, transit to the ON state, the eleventh transistor 66 is turned on and the twelfth transistor are turned off. As a result, the high voltage is applied to the common nodes of the first unit elements 5aA and 5aB, and each of the common nodes of the first unit elements 5aC and 5aD has an unfixed electrical potential. Moreover, the low voltage is applied to the second nodes of the first unit elements 5aA and 5aC, and each of the second nodes of the first unit elements 5aB and 5aD has an unfixed electrical potential.

At this time, in the case that electrical potentials of the common nodes or the second nodes of the first unit elements 5aB to 5aD, which are not the object for programming, fluctuates due to some reasons, it is caused that the first unit elements 5aB to 5aD carry out false works respectively to transit to the ON state. Accordingly, it is necessary to fix also the electrical potentials of the common nodes or the second nodes of the first unit elements 5aB to 5aD which are not the object for programming.

Then, it is assumed that the electrical potentials of the common nodes or the second nodes of the first unit elements 5aB to 5aD which are not the object for programming are set to low voltages respectively. In this case, the false work mentioned above is not caused.

However, in the case that insulation between the first wiring 71A and the first wiring 71B is not sufficient, a leak current flows between the first wiring 71A and the first wiring 71B. Therefore, a voltage, which the power supply applies to the first wiring 71A, is dropped gradually due to the leak current, and consequently the dropped voltage, that is, the insufficient voltage is applied to the common node of the first unit element 5aA which is the object for programming. That is, a case that the correct programming cannot be carried out is caused.

Taking the above-mentioned situation into consideration, middle-level voltages are applied to the first wiring 71B and the second wiring 72B connected with only the first unit elements 5aB to 5aD which are not the object for programming. The middle-level voltage means a middle-level voltage between the high voltage and the low voltage. Consequently, it is possible to make an amount of leak current small even if the leak current flows. As a result, it is possible to carry out the correct programming.

Ninth Exemplary Embodiment

Figure 16A:
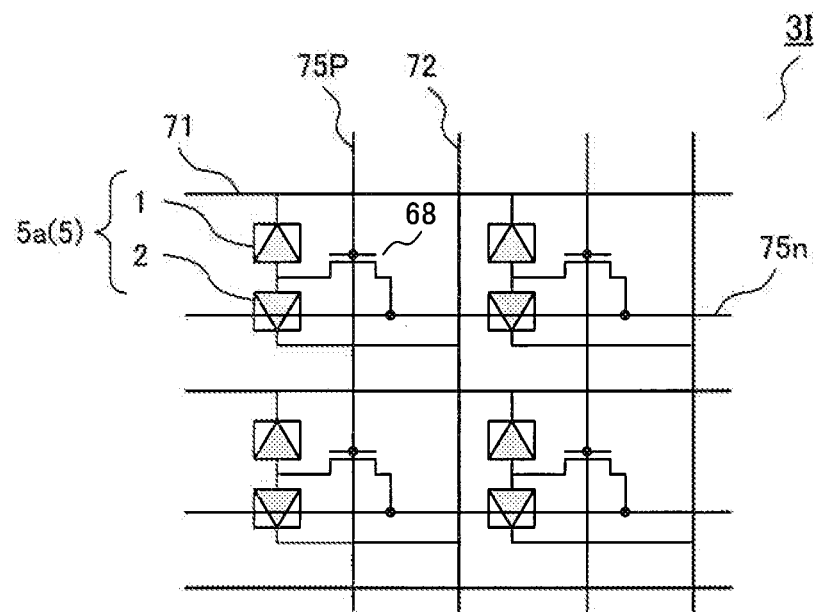
FIG. 16A shows composition of a semiconductor device, which uses a first unit element, according to a ninth exemplary embodiment of the present invention.
Figure 16B:
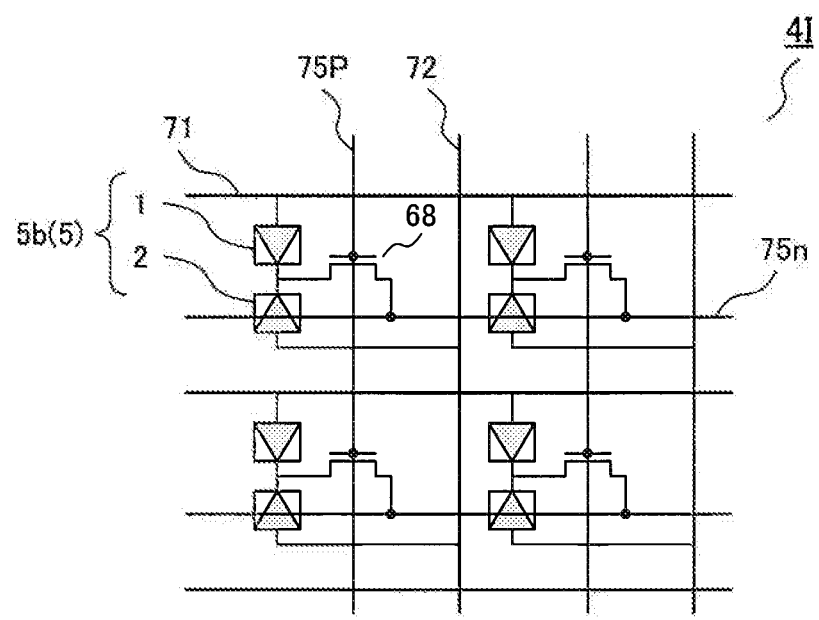
FIG. 16B shows composition of a semiconductor device, which uses a second unit element, according to the ninth exemplary embodiment of the present invention.

Next, an ninth exemplary embodiment according to the present invention will be described. Here, the same composition as one according to the first exemplary embodiment has the same code as one according to the first exemplary embodiment, and description on the same composition is omitted appropriately. FIGS. 16A and 16B shows composition of semiconductor devices 3I and 4I. Particularly, FIG. 16A shows composition of the semiconductor device 3I which uses the first unit element 5a, and FIG. 16B shows composition of the semiconductor device 4I which uses the second unit element 5b.

Each of the semiconductor devices 3I and 4I includes a thirteenth transistor 68, a thirteenth control line 75n and a fourteenth control line 75p in addition to the composition of the semiconductor devices 3A and 4A according to the first exemplary embodiment.

A drain, a source, and a gate of the thirteenth transistor are connected with the common node 3b, the thirteenth control line 75n, and the fourteenth control line 75p respectively.

An operation of the semiconductor devices 3I and 4I mentioned above will be described. Here, since a programming procedure of the semiconductor device 4I is almost the same as one of the semiconductor device 3I, only the programming procedure of the semiconductor device 3I will be exemplified in the following.

The programming procedure to conduct the first wiring 71 and the second wiring 72 each other in order to transmit a signal will be explained in the following. That is, it is assumed that the first unit element 5a is in the OFF state initially.

A high voltage with the positive polarity, which is higher than the set voltage, is applied to the thirteenth control line, and low voltages are applied to the first wiring and the second wiring respectively. On this bias condition, a control signal is applied to the fourteenth control line 75p so as to make the fourteenth transistor turned on. As a result, each of the first switch 1 and the second switch 2 enters into the state of forward bias, and consequently transits to the ON state. Accordingly, the first unit device 5a enters into the ON state. Afterward, the thirteenth transistor 68 is turned off. As a result, the common node 3b is separated from the thirteenth control line 75n, and it becomes possible to carry out signal transmission via the first wiring 71 and the second wiring 72.

In the case of disconnecting the first wiring 71 and the second wiring 72 each other, high voltages are applied to the first wiring 71 and the second wiring 72 respectively, and a low voltage is applied to the thirteenth control line 75n. Then, the thirteenth transistor 68 is turned on. As a result, each of the first switch 1 and the second switch 2 enters into the state of reverse bias, and consequently transits to the OFF state. Accordingly, the first unit element 5a enters into the OFF state. Afterward, the thirteenth transistor 68 is turned off. As a result, the first wiring 71 and the second wiring 72 are disconnected each other.

Here, even if the first switch 1 or the second switch 2 carries out a false work due to a noise or the like when the first element 5a is in the OFF state, it is prevented that the OFF disturbance is caused since either the first switch 1 or the second switch 2 maintains the OFF state.

According to the exemplary embodiments which have been described, the first wiring 71 and the second wiring 72 are skewed and the first control line 75a to the fourteenth control line 75p are arranged in parallel with the first wiring 71 or the second wiring 72. However, according to the present invention, it is not mandatory that each the control line is arranged in parallel with the first wiring 71 or the second wiring 72, but it is mandatory that each the control line does not come into contact electrically with the first wiring 71 or the second wiring 72.

Figure 17A:
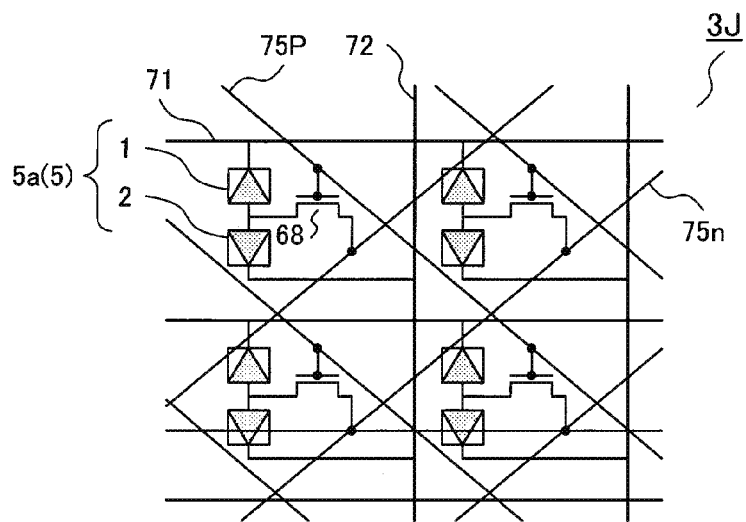
FIG. 17A shows composition of a semiconductor device, in which both of a thirteenth control line and a fourteenth control line are non-parallel with a first wiring and a second wiring, according to the ninth exemplary embodiment.
Figure 17B:
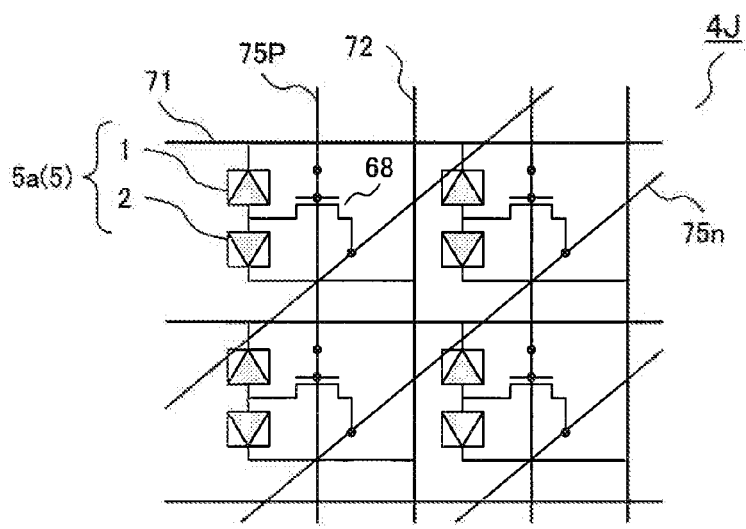
FIG. 17B shows composition of a semiconductor device, in which the thirteenth control line is non-parallel with the first wiring and the second wiring, and the fourteenth control line is parallel with the second wiring, according to the ninth exemplary embodiment.
Figure 17C:
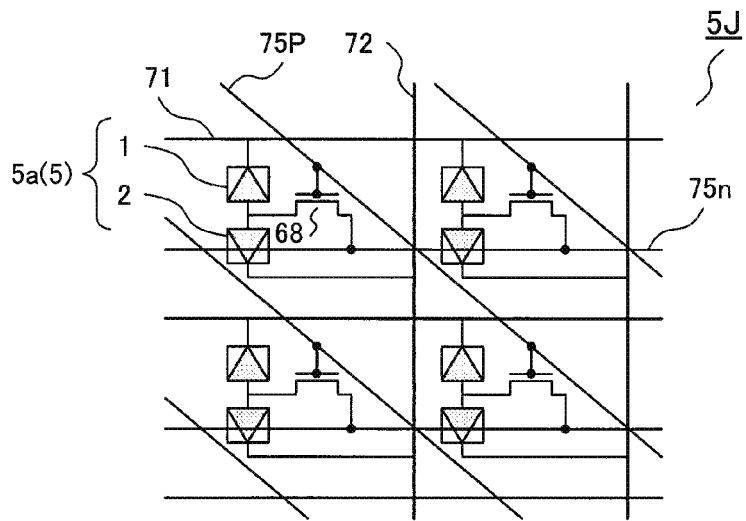
FIG. 17C shows composition of a semiconductor device, in which the fourteenth control line is non-parallel with the first wiring and the second wiring and the thirteenth control line is parallel with the first wiring, according to the ninth exemplary embodiment.

For example, as shown in FIGS. 17A to 17C, it is possible to arrange the control line in non-parallel with the first wiring 71 and the second wiring 72. FIG. 17C shows composition of a semiconductor device in which the thirteen control line 75n and the fourteenth control line 75p are not parallel with the first wiring 71 and the second wiring 72. FIG. 17A shows the composition of the semiconductor device in which both of the thirteenth control line 75n and the fourteenth control line 75p are not parallel with the first wiring 71 and the second wiring 72, and FIG. 17B shows the composition of the semiconductor device in which the thirteenth control line 75n is not parallel with the first wiring 71 and the second wiring 72 and the fourteenth control line 75p is parallel with the second wiring 72, and FIG. 17C shows the composition of the semiconductor device in which the fourteenth control line 75p is not parallel with the first wiring 71 and the second wiring 72 and the thirteenth control line 75n is parallel with the first wiring 71.

In the case that the thirteenth control line 75n or the fourteenth control line 75p are arranged in parallel with the first wiring 71 or the second wiring 72, a delay of signal transmission may be caused in some cases due to capacitive coupling between the control line and the wiring, or the like. However, through arranging the thirteenth control line 75n and the fourteenth control line 75p in non-parallel with the first wiring 71 and the second wiring 72 as shown in FIG. 17, a degree of the capacitive coupling becomes low. As a result, there is an advantage that it is possible to restrain the delay of signal transmission.

Tenth Exemplary Embodiment

Figure 18A:
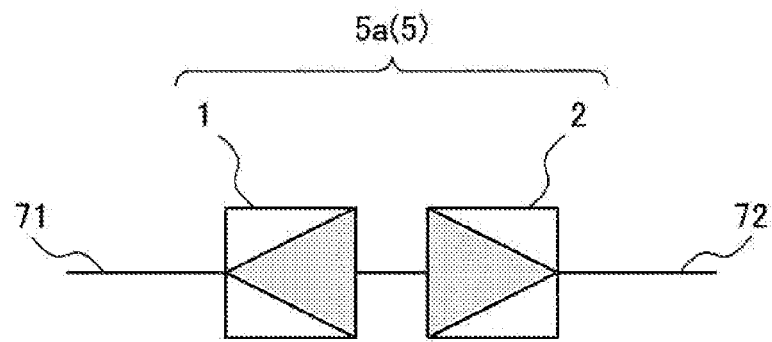
FIG. 18A shows schematic composition of a first unit element according to a tenth exemplary embodiment of the present invention.
Figure 18B:
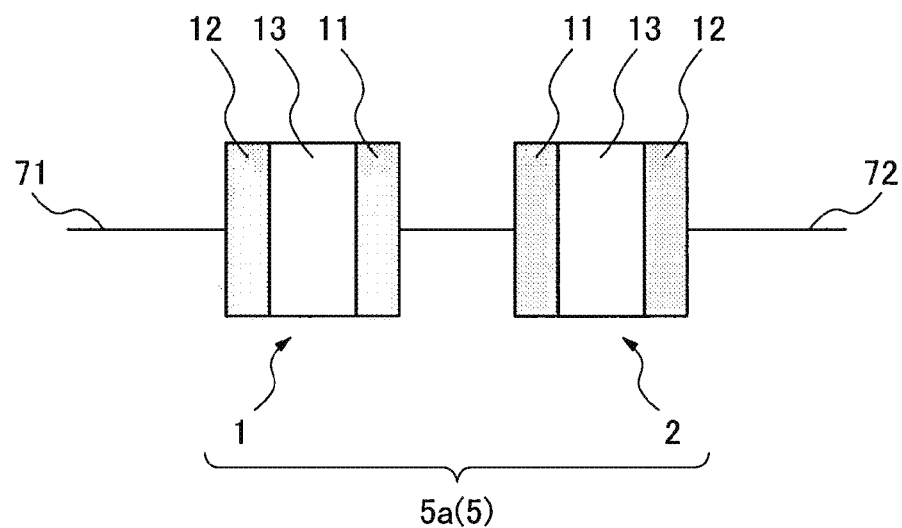
FIG. 18B is a schematic diagram showing detailed composition of a first switch and a second switch according to the tenth exemplary embodiment.

Next, a tenth exemplary embodiment according to the present invention will be described. Here, the same composition as one according to the first exemplary embodiment has the same code as one according to the first exemplary embodiment, and description on the same composition is omitted appropriately. FIGS. 18A and 18B is a schematic diagram showing the first unit element 5a. Particularly, FIG. 18A is a schematic diagram showing composition of the first unit element 5a, and FIG. 18B is a schematic diagram showing detailed composition of the first switch 1 and the second switch 2.

The first switch 1 and the second switch 2, which each of the first unit element 5a and the second unit element 5b includes, have the same composition. Accordingly, the first unit element 5a will be described in the following as an example.

Each of the first switch 1 and the second switch 2 includes an ion conductor 13, a first electrode 11 and a second electrode 12, and the ion conductor 13 is interposed between the first electrode 11 and the second electrode 12. The ion conductor 13 is made of a material which has an electrical resistance changing function. The first electrode 11 is arranged so as to come into contact with the ion conductor 13. Moreover, the first electrode 11 supplies the ion conductor 13 with a metal ion. Here, the second electrode 12 is made of a material which has the lower ionization tendency than the material of the first electrode 11 has.

A material, which includes any of an organic matter, organosiloxane, silicon carbide oxide, tantalum silicon oxide, tantalum oxide, zirconium oxide, hafnium oxide, silicon oxide and titanium oxide, is applicable to the ion conductor 13. Moreover, a material which includes copper as a main component is applicable to the first electrode 11, and a material which includes ruthenium or platinum is applicable to the second electrode 12. Here, the material including copper as the main component means a material whose copper content rate is not lower than 95%. Generally, in the case of a material whose copper content rate is not higher than 95%, an electrical resistance of the material becomes increasing. Therefore, the material may be improper as a wiring material in many cases. Operation reliability of the unit element is improved through forming the unit element by use of the material mentioned above.

Figure 19:
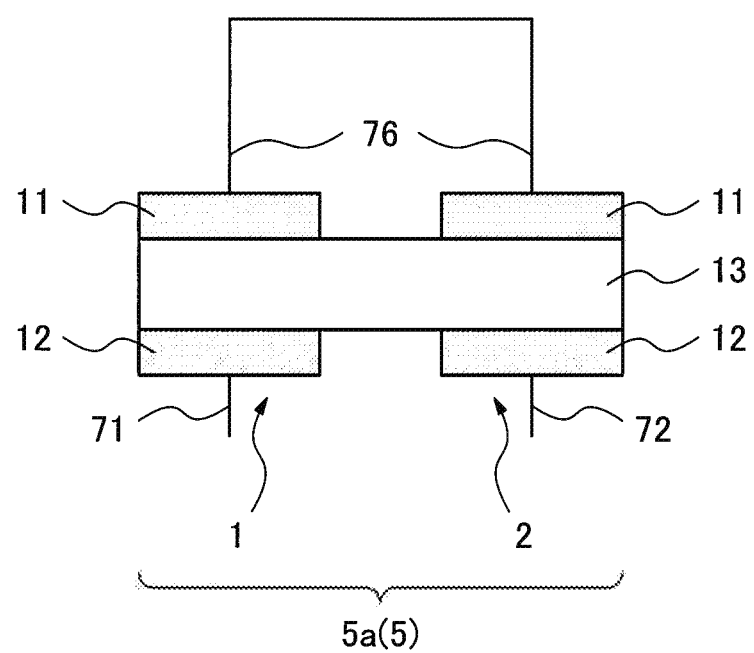
FIG. 19 shows schematic composition of the first unit element, in which ion conductors of the first switch and the second switch are united each other, according to the tenth exemplary embodiment.

Here, it is possible to form the ion conductor 13 so that the ion conductor 13 of the switch 1 and the ion conductor 13 of the switch 2 may be united each other when the electrodes of the first switch 1 and the second switch 2, which have the same polarity, are connected each other. FIG. 19 shows schematic composition of the first unit element 5a whose ion conductors 13 of the switch 1 and the switch 2 are formed so that the ion conductors 13 may be united each other. According to FIG. 19, the first electrodes 11 of the first switch 1 and the second switch 2 are formed so that the first electrodes 11 may be separated each other, and the first electrodes 11 are connected each other through a connection material 76.

There is an advantage that, in comparison with a case of forming the ion conductors 13 of the first switch 1 and the second switch 2 so that the ion conductors 13 may be separated each other, it becomes easy to produce the unit element through forming the ion conductors 13 of the first switch 1 and the second switch 2 so that the ion conductors 13 may be united each other as mentioned above.

Eleventh Exemplary Embodiment

Next, an eleventh exemplary embodiment according to the present invention will be described. Here, the same composition as one according to the tenth exemplary embodiment has the same code as one according to the tenth exemplary embodiment, and description on the same composition is omitted appropriately. The first switch 1 and the second switch 2, which each of the first unit element 5a and the second unit element 5b includes, have the same composition. Then, the first unit element 5a will be described in the following as an example.

Figure 20A:
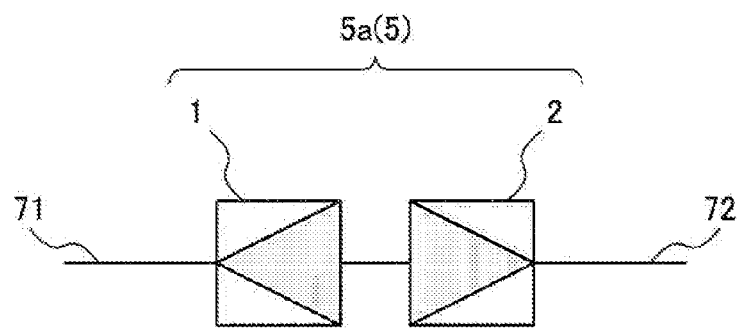
FIG. 20A shows schematic composition of the first unit element according to the tenth exemplary embodiment of the present invention.
Figure 20B:
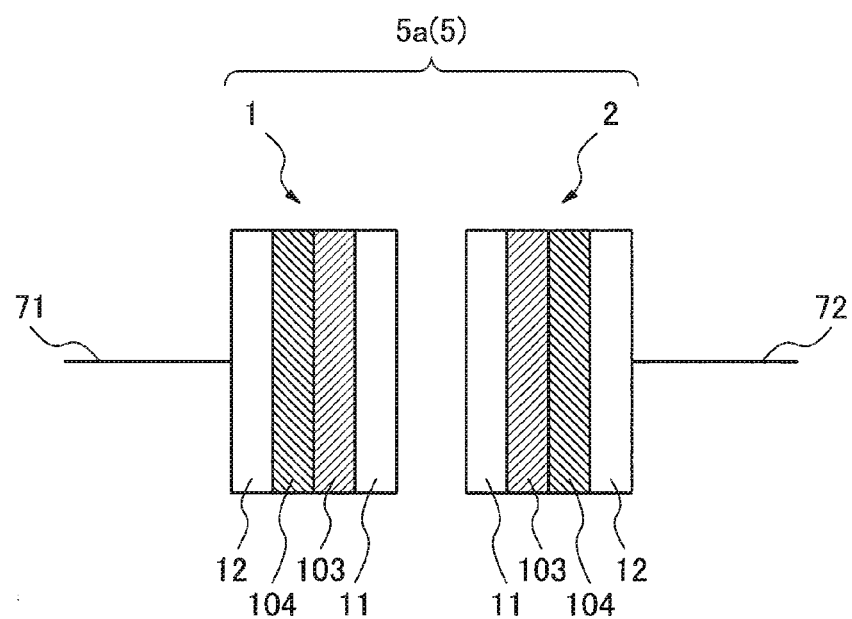
FIG. 20B is a schematic diagram showing detailed composition of the first unit element according to the tenth exemplary embodiment.
Figure 21A:
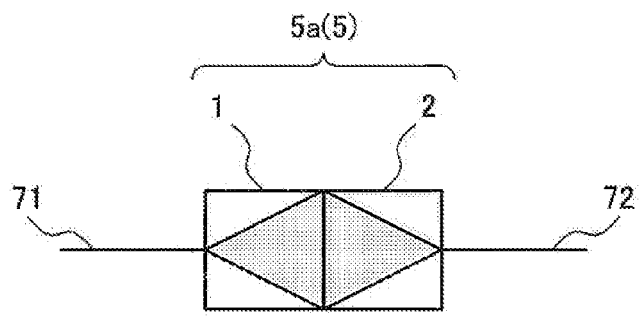
FIG. 21A is a schematic diagram showing a first unit element, which has composition based on a different connection method, according to an eleventh exemplary embodiment of the present invention.
Figure 21B:
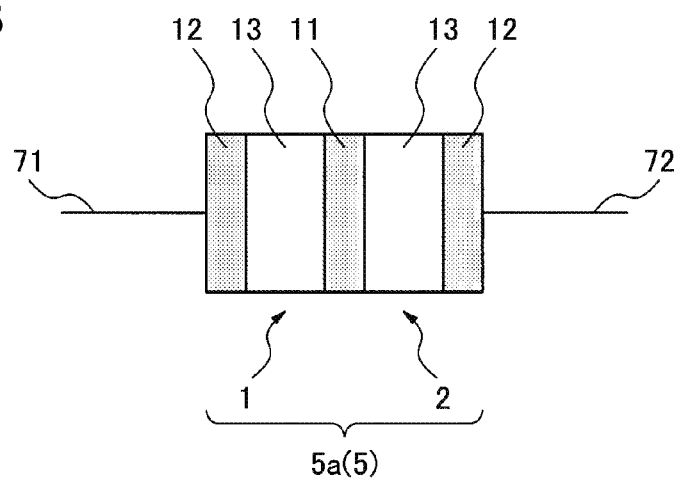
FIG. 21B a schematic diagram showing detailed composition of a first switch and a second switch according to the eleventh exemplary embodiment.
Figure 21C:
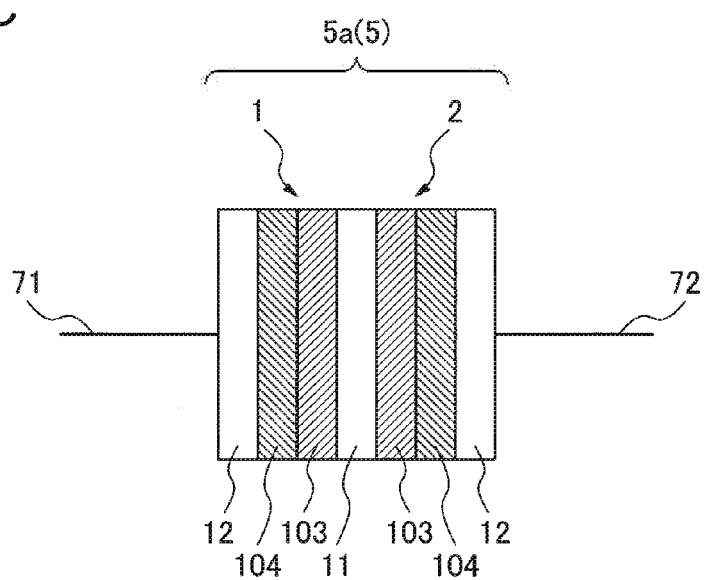
FIG. 21C is a schematic diagram showing a wiring, which is applied in the case that an ion conductor is made of a plurality of transition metal oxide layers, according to the eleventh exemplary embodiment.

FIGS. 20A and 20B is a schematic diagram showing the first unit element 5a. Particularly, FIG. 20A is a schematic diagram showing composition of the first unit element 5a, and FIG. 20B is a schematic diagram showing detailed composition of the first unit element 5a. Moreover, FIGS. 21A to 21C is a schematic diagram of another first unit element 5a whose composition is different in a connection method from the composition of the first unit element 5a shown in FIG. 20. That is, FIG. 21A is a schematic diagram showing the first unit element 5a, and FIG. 21B is a schematic diagram showing detailed composition of the first switch 1 and the second switch 2, and FIG. 21C is a schematic diagram showing a connection, which is applied in the case that the ion conductor 13 is made of a plurality of transition metal oxide layers Here, FIG. 21B is corresponding to the composition of the first unit element 5a shown in FIG. 18, and FIG. 21C is corresponding to the composition of the first unit element 5a shown in FIG. 20.

The ion conductor 13 according to the exemplary embodiment includes a first transition metal oxide film layer 103 and a second transition metal oxide film layer 104.

That is, each of the first switch 1 and the second switch 2 includes the ion conductor 13 made of a lamination of the first transition metal oxide film layer 103 and the second transition metal oxide film layer 104. Then, the first electrode 11, the first transition metal oxide film layer 103, the second transition metal oxide film layer 104 and the second electrode 12 are laminated in this order. In this case, the first transition metal oxide film layer 103 is made of a material including titanium oxide or nickel oxide. Moreover, the second transition metal oxide film layer 104 is made of a material which includes at least one of tantalum oxide, zirconium oxide and hafnium oxide.

According to the exemplary embodiment, there is an advantage at least that number of processes of the operation can be reduced through forming the electrodes 11 of the first switch 1 and the second switch 2 so that the electrodes 11 may be united each other, when comparing with a case that the electrodes are formed so that the electrodes may be separated each other. Moreover, reliability of the process is improved in comparison with a case that the first electrode 11 of the first switch 1 and the first electrode 11 of the second switch 2 are formed so that the electrodes 11 may be separated each other, and the first electrodes 11 are connected each other via a connection material. Furthermore, there is an advantage that it is possible to realize the large scale integration and it is possible to restrain a signal delay since it is possible to make a distance between the first switch 1 and the second switch 2 short.

Twelfth Exemplary Embodiment

Next, a twelfth exemplary embodiment according to the present invention will be described. Here, the same composition as one according to the eleventh exemplary embodiment has the same code as one according to the eleventh exemplary embodiment, and description on the same composition is omitted appropriately.

Figure 22:
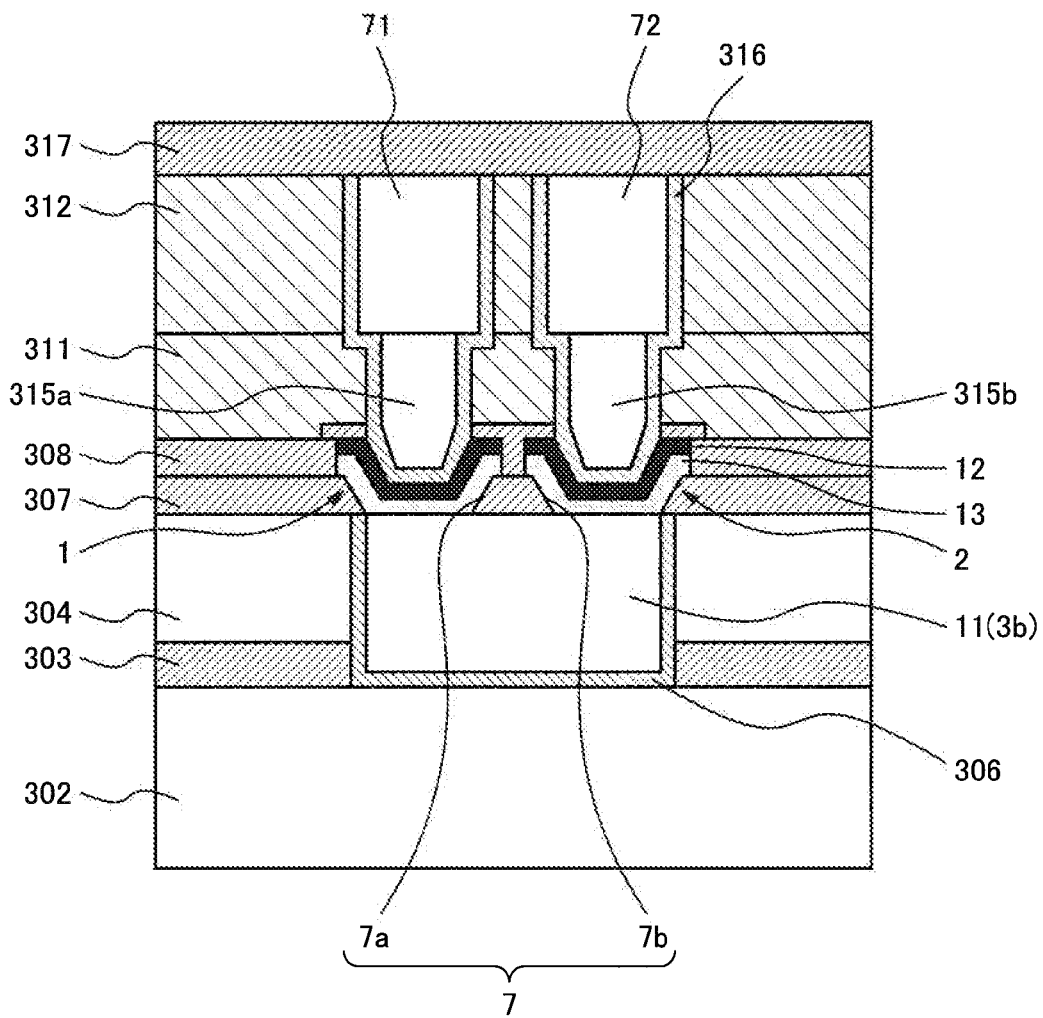
FIG. 22 is a schematic cross section view of a semiconductor device, which uses a first unit element, according to a twelfth exemplary embodiment of the present invention.

FIG. 22 is a schematic cross section view of the semiconductor device 3A which uses the first unit element 5a and is described in the eleventh exemplary embodiment. Here, the first electrodes 11 of the first switch 1 and the second switch 2 are formed so that the electrodes 11 may be united each other as shown in FIG. 21B or FIG. 21C.

Moreover, the first unit element 5a is arranged within multi-layered wiring layers 303, 304, 307, 308, 311, 312, 313 and 317 which are arranged on a semiconductor substrate 302. That is, the first switch 1 includes the first electrode 11, the second electrode 12 and the ion conductor 13 which is interposed between the first electrode 11 and the second electrode 12. The first electrodes 11 of the first switch 1 and the second switch 2, which are arranged so that the electrodes 11 may be united each other, forms the common node 3b.

The first electrode 11 works as a connection line (for example, connection line 6b shown in FIG. 14B), and the insulation barrier film 307 is arranged between the first electrode 11 and the ion conductor 13. The insulation barrier film 307 has two openings 7 (7a and 7b) which penetrate the insulation barrier film 307 to reach the first electrode 11, and the ion conductor 13 is embedded in the openings 7 so that the openings 7 may be filled up. At this time, two ion conductors 13 are arranged side by side correspondingly to the first switch 1 and the second switch 2. Moreover, two second electrodes 12, which are corresponding to the first switch 1 and second switch 2, are formed on the ion conductors 13, and plugs 315a and 315b, each of which is corresponding to an inter-layer connection line, are formed on two second electrodes 12 respectively. The first wiring 71 and the second wiring 72, which are corresponding to the first node 3a and the second node 3c, are formed on the plug 315a and the plug 315b respectively.

Figure 23:
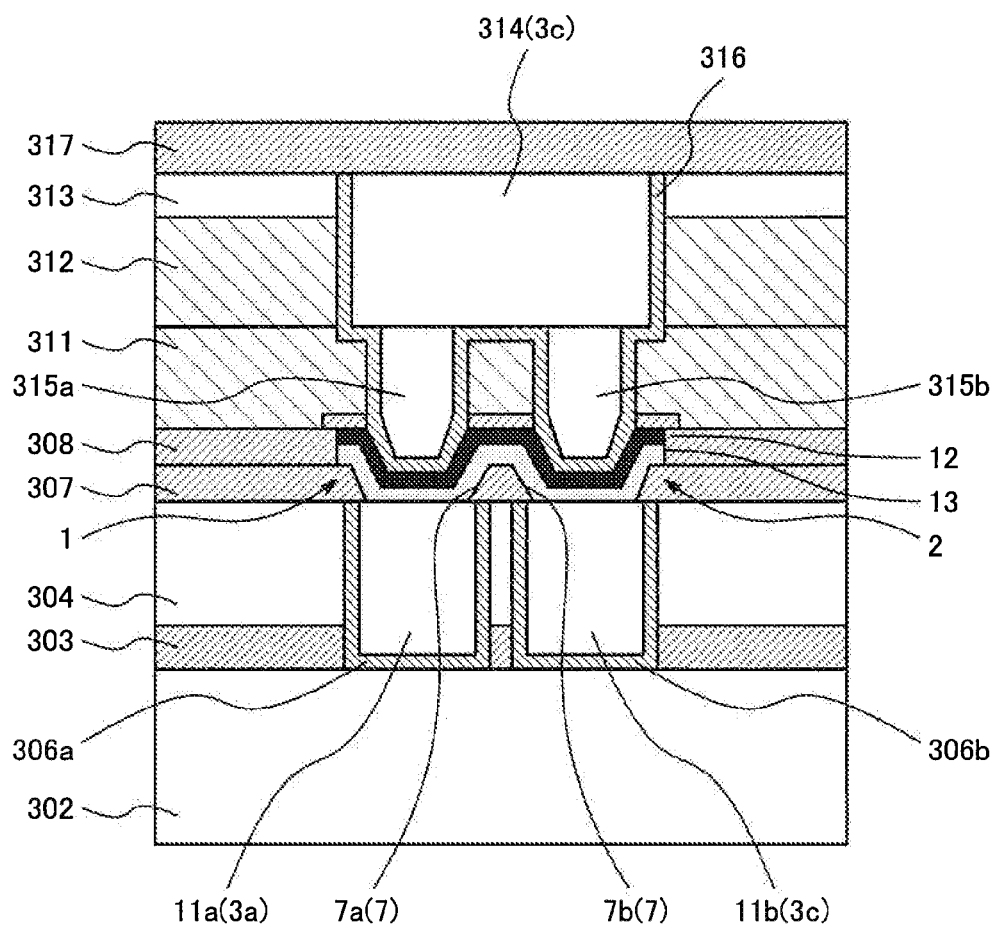
FIG. 23 is a schematic cross section view of a semiconductor device, which uses a second unit element, according to the twelfth exemplary embodiment.

Next, a semiconductor device including the second unit element 5b will be described. FIG. 23 is a schematic cross section view of the semiconductor device 4A which uses the second unit element 5b.

Similarly to the first unit element 5a, the second unit element 5b is arranged within the multi-layered wiring layers 303, 304, 307, 308, 311, 312, 313 and 317 which are arranged on the semiconductor substrate 302.

Moreover, two first electrodes 11a and 11b are arranged side by side on the semiconductor substrate 302, and the ion conductor 13 is formed on the first electrodes 11a and 11b. The second electrodes 12 of the first switch 1 and the second switch 2 are arranged on the ion conductor 13 so that the electrodes 12 may be united each other, and the united second electrode 12 forms the common node 3b. Here, two first electrodes 11 form the first node 3a and the second node 3c respectively.

The insulation barrier film 307, which have two openings 7, is formed between the first electrode 11a and the ion conductor 13 and between the first electrode 11b and the ion conductor 13, and the ion conductor 13 is arranged so that this opening 7 may be filled up. In this case, the ion conductor 13 is divided into two parts which are separated each other. One part is used for the first switch and the other part is used for the second switch. That is, the ion conductor 13 has the composition shown in FIG. 18.

The plugs 315a and 315b each of which is corresponding to the inter-layer connection line are formed on the second electrode 12, and a connection material 314, which is corresponding to the common node 3b, is arranged on the plugs 315a and 315b. By virtue of the composition, it is possible to produce the first unit element and the second unit element when the multi-layered wiring layers are formed in the semiconductor device. Therefore, it is not necessary to change the conventional production process of the semiconductor device on a large scale. Accordingly, it is possible to use the conventional production process as it is. As a result, it is possible to produce the semiconductor device, which includes the reliable unit element, with low cost.

Here, composition of a semiconductor device which includes the second unit element 5b is not limited to the composition mentioned above. For example, composition shown in FIG. 24 may be preferable. The composition shown in FIG. 24 is corresponding to one shown in FIG. 19, and the ion conductor of the first switch and the ion conductor of the second switch are united each other as one ion conductor 13.

That is, the insulation barrier film 307, which includes the opening 7 (7a and 7h) arranged side by side, is arranged on the first two electrodes 11a and 11b, which are arranged side by side, in the second unit element 5h. Since the opening 7 is formed so as to straddle the first electrode 11a of the first switch 1 and the first electrode 11b of the second switch 2, the ion conductors 13 of the first switch 1 and the second switch 2 are united each other as one ion conductor 13 through forming the ion conductor 13 so that the ion conductor 13 may fill up the opening 7.

Figure 24:
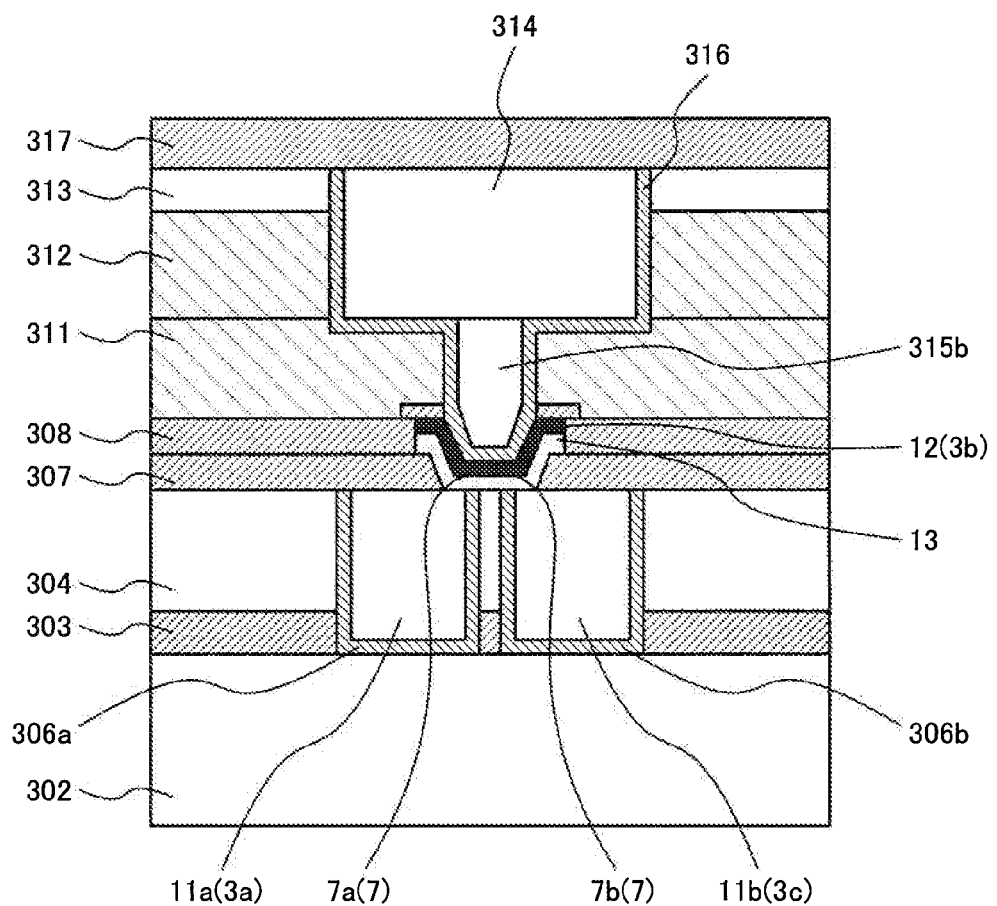
FIG. 24 is a schematic cross section view of a semiconductor device, which uses a second unit element having another composition, according to the twelfth exemplary embodiment.

The first electrode 11 shown in FIGS. 22 to 24 is made of a material whose main component is an element supplying a metal ion such as copper. Moreover, the second electrode 12 is made of a material such as ruthenium or platinum which has lower ionization tendency than the first electrode 11 has. A material including at least one of an organic matter such as organosiloxane or the like, silicon carbide oxide, tantalum silicon oxide, tantalum oxide, zirconium oxide, hafnium oxide, silicon oxide and titanium oxide which can conduct a metal ion, is applicable to the ion conductor 13. Here, the material including copper as the main component means a material whose copper content rate is not lower than 95%. Generally, in the case of a material whose copper content rate is not higher than 95%, an electrical resistance of the material becomes increasing.

Since it is possible to produce the first unit element and the second unit element by virtue of the composition when forming the multi-layered wiring layers in the semiconductor device, it is unnecessary to change the conventional production process in the semiconductor device. Accordingly, since the conventional production process is applicable as it is, it is possible to produce the semiconductor device, which includes the reliable unit element, with low cost.

EXAMPLE

Figure 25:
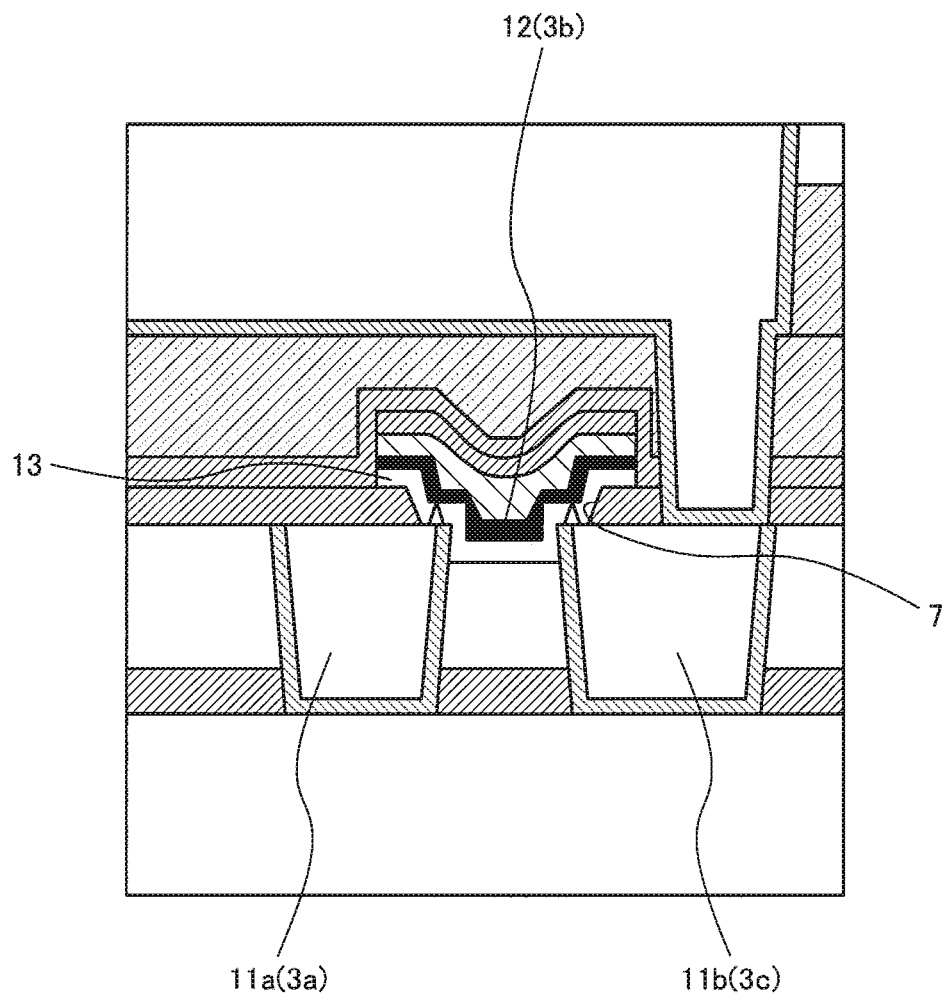
FIG. 25 is a cross section view of a semiconductor device, which is a trial product, according to an example of the present invention.
Figure 26A:
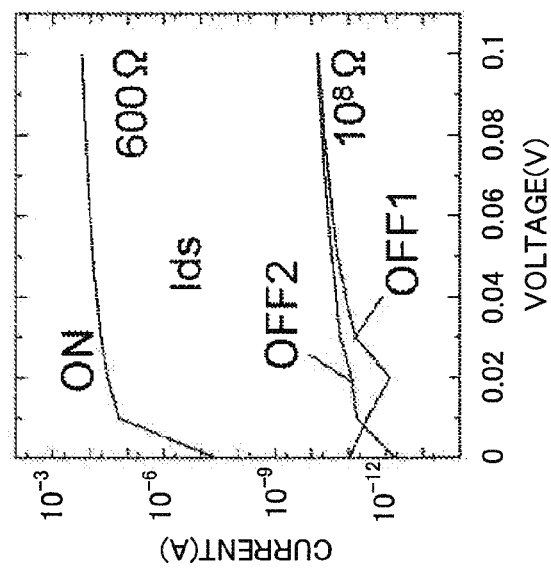
FIG. 26A shows a measurement result on a current, which flows when the first switch and the second switch transit to an ON state in the case of applying a voltage to each node, according to the example.
Figure 26B:
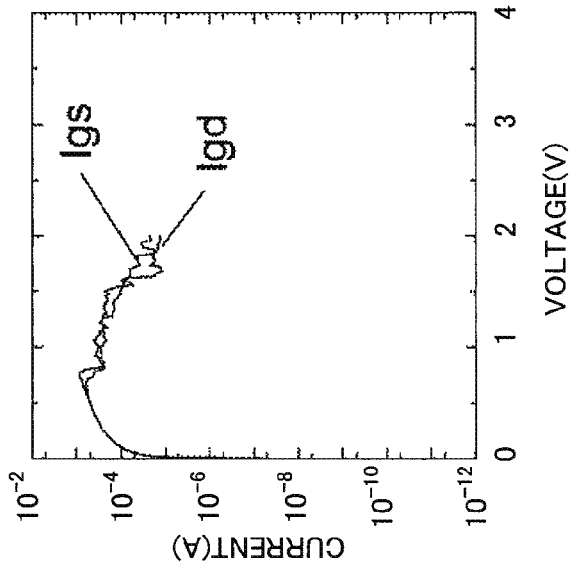
FIG. 26B shows a measurement result on a current, which flows when the first switch and the second switch transit to an OFF state, according to the example.
Figure 26C:
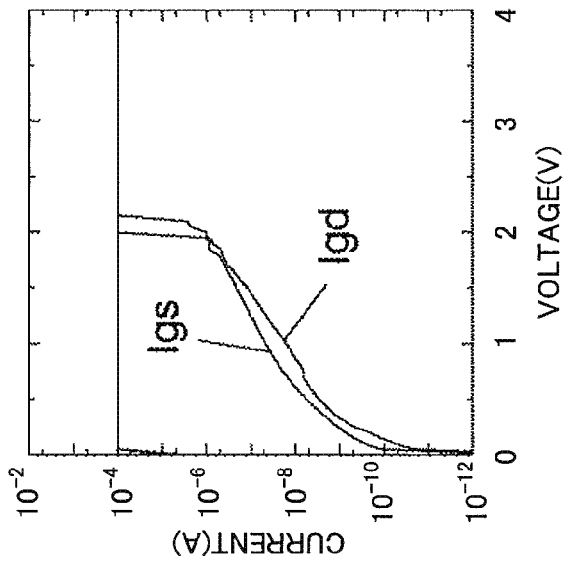
FIG. 26C is a diagram for explaining that a current, which flows through the second unit element when transiting to the ON state or the OFF state, is dependent (or not dependent) on an applied voltage.

Next, the semiconductor device shown in FIG. 24 has been produced for a trial, and voltage versus current characteristics of the unit element is measured. FIG. 25 is a cross section view of the produced semiconductor device, and FIGS. 26a to 26C indicates a measurement result on the voltage versus current characteristics when applying a voltage on each the node. FIG. 26A shows a measurement result on a current which flows when the first switch 1 and the second switch 2 transit to the ON state. FIG. 26B shows a measurement result on a current which flows when the first switch 1 and the second switch 2 transit to the OFF state. FIG. 26C shows that a current, which flows through the second unit element when transiting to the ON state or the OFF state, is not dependent on an applied voltage.

Since the second unit element 5b is in the OFF state initially, a value of an electrical resistance between the first node 3a and the second node 3c is changed as shown by a curve OFF1 in FIG. 26C and is about $10^8 \Omega$. That is, it is confirmed that the second unit element 5b is in the OFF state.

Next, in order to make the second unit element 5b transit to the ON state, a voltage is applied between the first node 3a and the common node 3b so as to make the first switch enter into the state of forward bias, and afterward a voltage is applied between the common node 3b and the second node 3c so as to make the second switch enter into the state of forward bias. Here, in the case that a low voltage is applied to the common node 3b, high voltages with the positive polarity are applied to the first node 3a and the second node 3c.

Currents which flow through the first switch and the second switch are denoted as a current Igs and a current Igd respectively (refer to FIG. 26A). Moreover, since changes in the values of the electrical resistance of the first switch and the second switch are caused steeply, a value of a current is limited to 100 μA when measuring the current. Then, a voltage which is corresponding to the current of 100 μA is defined as the set voltage. According to this definition, the set voltage is about 2V as shown in FIG. 26A.

In order to confirm that the second unit element 5b transits to the ON state, voltage versus current characteristics between the first node 3a and the second node 3c is measured. As a result, a curve ON shown in FIG. 26C is obtained. It is confirmed that the second unit element 5b transits to the ON state since a value of an electrical resistance of the second unit element 5b is found out to be about 600Ω on the basis of the curve.

Next, in order to make the second unit element 5b transit to the OFF state, low voltages are applied to the first node 3a and the second node 3c respectively, and a high voltage with the positive polarity is applied to the common node 3b. FIG. 26B shows a measurement result on the current Igs and the current Igd which flow through the first switch 1 and the second switch 2 respectively on this bias condition. When the voltage applied to the common node 3b exceeds about 1V, the currents Igs and Igd become decreasing as the voltage becomes increasing. This means that the value of the electrical resistance of the second unit element becomes increasing.

In order to confirm that the increase of the value of the electrical resistance is caused by the transition of the second unit element to the OFF state, the voltage versus current characteristics between the first node 3a and the second node 3c is measured. A curve OFF2 in FIG. 26C is obtained by this measurement. The curve OFF2 is approximately coincident with the curve OFF1. Accordingly, it is confirmed that the second unit element 5b transits to the OFF state.

As described above, it is confirmed that the second unit element 5b transits to the ON state or the OFF state, and maintains the transition state even if it is stopped to apply the voltage. That is, it is confirmed that the second unit element 5b works as the non-volatile memory switch.

Figure 27A:
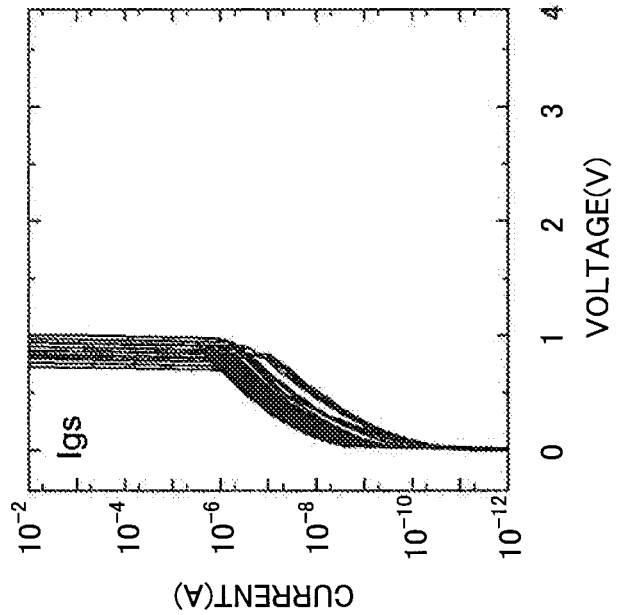
FIG. 27A shows a measurement result on a value of a current which flows when applying a voltage between a first node and a second node, according to the example.
Figure 27B:
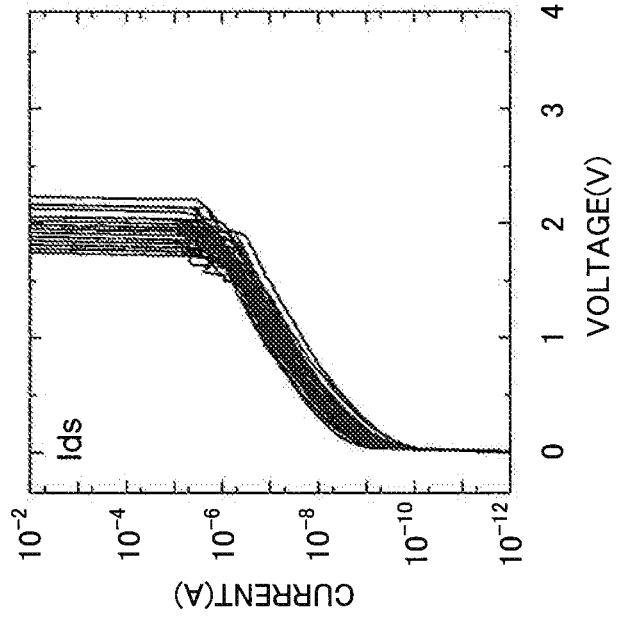
FIG. 27B shows a measurement result of a value of a current which flows when applying a voltage between a common node and the second node, according to the example.

Next, reliability (disturbance characteristics) of the second unit element is evaluated. FIGS. 27A and 27B shows a result obtained through measuring current versus voltage characteristics of the second unit element 5b, which is in the OFF state, plural times at an environmental temperature of 125 degree Cohere, FIG. 27A shows a value of a current (Ids) which flows when applying a voltage between the first node 3a and the second node 3c, and FIG. 27B shows the value of the current (Igs) which flows when applying a voltage between the common node 3b and the second node 3c. According to FIG. 27A, the current value Ids becomes increasing steeply at about 4V. Meanwhile, the current value Igs becomes increasing steeply at about 2V according to FIG. 27B. Since the current value Igs is a value of a current which flows through the second switch 2, it is found that the second switch 2 transits to the ON state at about 2V. This shows that the second switch 2 transits to the ON state through carrying out the false work. In contrast, it is found that the second unit element 5b is caused the insulation destruction, taking it into consideration that the current value Ids is a value of a current which flows through the second unit element 5b. However, it is confirmed that the second unit element 5b maintains the OFF state, since the voltage at which the second switch 2 carries out the false work is 2V, and the voltage at which the second unit element 5a is caused the insulation destruction is 4V, even if the second unit element 5b carries out the false work. That is, the off disturbance of the second unit element is prevented.

By the measurement mentioned above, it is proved that the reliability of the semiconductor device which uses the unit element mentioned above is improved since a withstanding voltage (insulation destroying voltage) between the first node 3a and the second node 3c is larger than the programming voltage.

Here, a noteworthy point for improving the OFF disturbing properties will be described.

In order to secure the reliability on the insulation of the unit element, it is desirable that insulation electrical-resistances (OFF electrical resistance) of the first switch 1 and the second switch 2 are the same value each other as far as possible. The reason is that, in the case that values of the OFF electrical resistances of the first switch and the second switch are different each other, there is a fear that the voltages applied to the switches are not equal, and a high voltage is applied to one switch out of the first switch and the second switch. In order to make the values of the OFF electrical resistances of the first switch and the second switch equal, it is desirable that an area of the opening 7 for the first electrode 11a and an area of the opening 7 for the first electrode 11b are equal (opening 7 is shown in FIG. 25). That is, it is desirable to form the opening 7 so that a center position of the opening 7 and a center position between the first electrode 11a and the first electrode 11b may be incident each other. Through forming the opening 7 in the way mentioned above, it is possible to make a contact area of the ion conductor 13 with the first electrode 11a, and a contact area of the ion conductor 13 with the first electrode 11b equal. As a result, it is possible to make the OFF electrical resistances almost equal.

Figure 28:
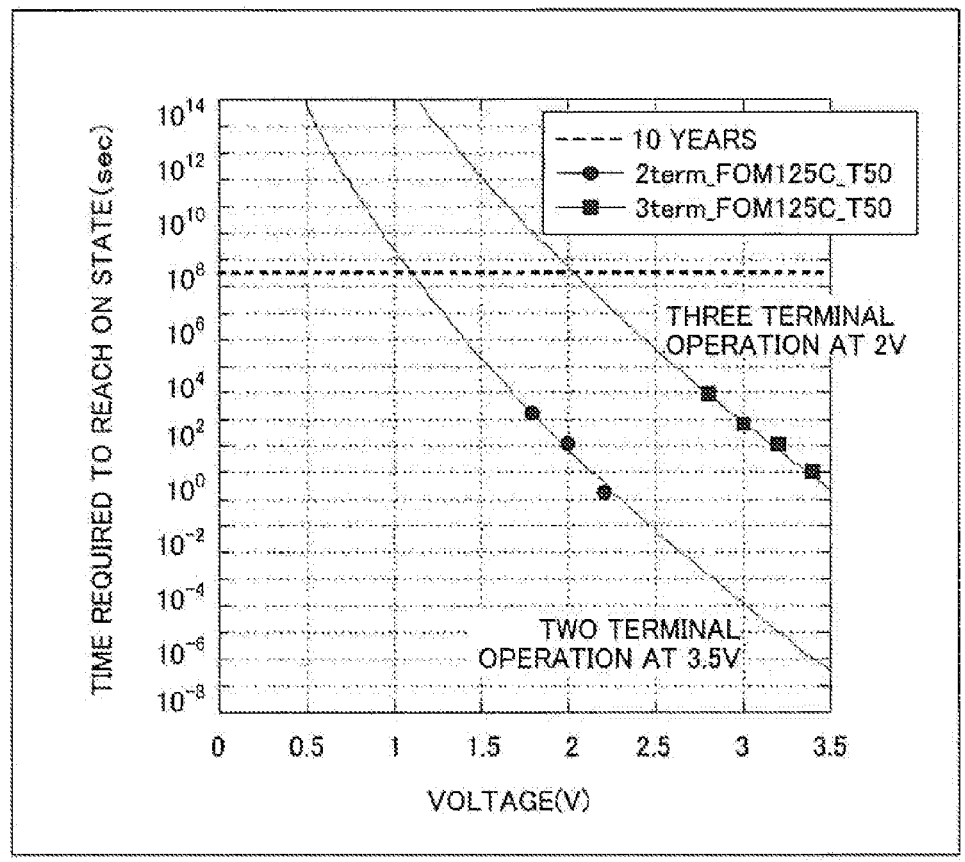
FIG. 28 shows a comparison result between operation properties of the semiconductor device according to the example, and operation properties of a semiconductor device which uses the conventional two-terminal type switching element.

FIG. 28 shows a comparison between operation properties of a semiconductor device which uses the conventional two-terminal type switching element (switching element corresponding to an unit element which is formed by use of only the first switch or only the second switch in the present example), and operation properties of the semiconductor device according to the present example.

In the case of comparing the operation properties of the conventional two-terminal type switching element, and the operation properties of the semiconductor device according to the present example, it is found out that a life of the semiconductor device according to the present example, which is predicted on the condition that the applied voltage is 1 V, is prolonged from 10 years ($10^8$ sec) to not shorter than one million years.

While the present invention has been described by use of some preferable exemplary embodiments and the preferable example, the exemplary embodiment and the example do not limit the present invention and are not limited.

While the semiconductor device including the unit element, which carries out a function of the switch arranged between the first wiring and the second wiring, has been described in the above description, the present invention is not limited to the semiconductor device mentioned above. The present invention is applicable to, for example, a semiconductor device which includes a memory circuit such as DRAM (Dynamic Random Access Memory), SRAM (Static Random Access Memory), the flash memory, FRAM (Ferro Electric Random Access Memory), MRAM (Magnetic Random Access Memory) or the bipolar transistor, a semiconductor device which includes a logic circuit such as the microprocessor, or a wiring of a board, a package or the like which includes both of the semiconductor device including the memory circuit, and the semiconductor device including the logic circuit.

Moreover, the unit element according to the present invention is applicable to the switching in an electronic circuit device, an optical circuit device, a quantum circuit device, a micro machine, MEMS (Micro Electro Mechanical Systems) or the like which is used in the semiconductor device. Moreover, while the example has been described mainly by use of the switching function in the present invention, the present invention is also applicable to a memory element or the like which uses both of the non-volatility properties and the electrical resistance changing properties.

It is apparent at a time after reading the present specification that it is easy for a person skilled in the art to carry out various changes and various substitutions by use of an equivalent component and an equivalent art, and it is also apparent that the change and the substitution are corresponding to the true range and spirit of the attached claim.

DESCRIPTION OF THE CODE

1 First switch
2 Second switch
3A to 3J, 4A to 4J, and 5J Semiconductor device
3a First node
3b Common node
3c Second node
5aA to 5aD First unit element
5 Unit element
5a First unit element
5b Second unit element
6a to 6g Connection line
11a and 11b First electrode
11 First electrode
12 Second electrode
13 Ion conductor
42 Fifth transistor (signal unit connection control transistor)
43 Eighth transistor (common node electrical potential control transistor)
44 Ninth transistor (common node electrical potential control transistor)
45 Sixth transistor (power supply connection control transistor)
46 Seventh transistor (signal unit connection control transistor)
47 Tenth transistor
61 First transistor (power supply connection control transistor)
63 Third transistor (common node electrical potential control transistor)
63d Fourth transistor
65 Second transistor (power supply connection control transistor)
66 Eleventh transistor (bypass transistor)
67 Twelfth transistor (bypass transistor)
68 Thirteenth transistor
71, 71A and 71B First wiring
72, 72A and 72B Second wiring
75a First control line
75b Second control line
75c Third control line
75d Fourth control line
75e Fifth control line
75f Sixth control line
75g Seventh control line
75h Eighth control line
75i Ninth control line
75j Tenth control line
75k Eleventh control line
75m Twelfth control line
75n Thirteenth control line
75p Fourteenth control line
76 Connection material
103 First transition metal oxide film layer
104 Second transition metal oxide film layer

The invention claimed is:

1. A semiconductor device, comprising:
an unit element which includes a first switch and a second switch, wherein
each of the first switch and the second switch includes an electrical resistance changing layer whose state of electrical resistance is changed corresponding to a polarity of an applied voltage, and each of the first switch and the second switch has two electrodes, and wherein
one electrode of the first switch and one electrode of the second switch are connected each other to form a common node, and the other electrode of the first switch forms a first node, and the other electrode of the second switch forms a second node;
a first wiring which is connected with the first node, and forms a signal transmission line; and
a second wiring which is connected with the second node, and is connected with the first wiring through the unit element.

2. The semiconductor device according to claim 1, wherein the first wiring and the second wiring are skewed each other.

3. The semiconductor device according to claim 1, wherein a plurality of wirings which include at least one of the first wiring and the second wiring are arranged, and a plurality of the unit elements are arranged correspondingly to the plural first wirings or the plural second wirings.

4. The semiconductor device according to claim 1, wherein the electrical resistance changing layer is an ion conductor which transits to any one of a state of high electrical resistance and a state of low electrical resistance corresponding to the polarity of the applied voltage;
one out of two electrodes is an active electrode which supplies a metal ion to the ion conductor; and
the other electrode is an inactive electrode which has an ionization tendency lower than the active electrode has.

5. The semiconductor device according to claim 1, wherein the common node is a connection point where the active electrodes are connected each other, or a connection point where the inactive electrodes are connected each other.

6. The semiconductor device according to claim 1, further comprising:
a power supply connection control transistor which is connected with at least one of the first wiring and the second wiring, wherein
the power supply connection control transistor controls a state of connection between the power supply whose output voltages are applied to at least two node of the first node, the second node and the common node, and at least one wiring out of the first wiring and the second wiring, when making the first switch and the second switch transit to the state of electrical resistance.

7. The semiconductor device according to claim 1, further comprising:
a signal unit connection control transistor which is connected with both a sending portion which transmits a signal through the first wiring and the second wiring or a receiving portion which receives the signal, and at least one wiring out of the first wiring and the second wiring, wherein
the signal unit connection control transistor controls a state of connection between the sending portion or the receiving portion, and at least one wiring of the first wiring and the second wiring, when making the first switch and the second switch transit to the state of electrical resistance.

8. The semiconductor device according to claim 7, wherein in the case that the power supply connection control transistor is a P type MIS transistor or a N type MIS transistor, the signal unit connection control transistor is the N type MIS transistor or the P type MIS transistor respectively.

9. The semiconductor device according to claim 1, further comprising:
a common node electrical potential control transistor which controls a state of connection between the common node and the power supply which is used when making the first switch and the second switch transit to the state of the electrical resistance through applying voltages to at least two node of the first node, the second node and the common node.

10. The semiconductor device according to claim 1, further comprising:
a bypass transistor which makes either the first switch or the second switch short-circuited so as to make the applied voltage reach directly either the second switch or the first switch which is in a state of non-short-circuit, when making the first switch and the second switch transit to the state of electrical resistance through applying voltages to at least two nodes of the first node, the second node and the common node.

11. The semiconductor device according to claim 9, wherein
in the case that two kinds of voltages are applied, two common node electrical potential control transistors are used.

12. The semiconductor device according to claim 10, further comprising:
a plurality of control lines for carrying out ON and OFF control to, at least, the power supply connection control transistor, the signal unit connection control transistor, the common node electrical potential control transistor and the bypass transistor, wherein
at least one control line of the plural control lines is arranged in non-parallel with the first wiring line or the second wiring line.

13. The semiconductor device according to claim 4, wherein
the ion conductor of the first switch and the ion conductor of the second switch integrated.

14. The semiconductor device according to claim 4, wherein
the ion conductor includes any one of an organic matter, organosiloxane, silicon carbide oxide, tantalum silicon oxide, tantalum oxide, zirconium oxide, hafnium oxide, silicon oxide and titanium oxide, wherein the active electrode includes copper as a main component, and
the inactive electrode includes ruthenium or platinum.

15. The semiconductor device according to claim 4, wherein
the ion conductor is formed through laminating a plurality of layers each of which includes the transition metal oxide.

16. The semiconductor device according to claim 15, wherein
the transition metal oxide, comprising:
a first transition metal oxide film layer which includes titanium oxide or nickel oxide; and
a second transition metal oxide film which includes at least one of tantalum oxide, zirconium oxide, and hafnium oxide, wherein
the first transition metal oxide film comes into contact with the active electrode, and the second transition metal oxide film comes into contact with the inactive electrode.

17. The semiconductor device according to claim 4, wherein
the active electrodes or the inactive electrodes of the first switch and the second switch, which are corresponding to the common node, are formed as a unite.

18. The semiconductor device according to claim 4, wherein
the active electrode or the inactive electrode of the first switch, which is corresponding to the first node, is formed as a unite with the first wiring.

19. The semiconductor device according to claim 4, wherein
the active electrode or the inactive electrode of the second switch, which is corresponding to the second node, is formed as a unite with the second wiring.

20. The semiconductor device according to claim 1, wherein
the first wiring and the second wiring are formed in the same wiring layer of multi-layered wiring layers of the semiconductor device, and wherein
the first switch and the second switch are arranged in a layer which is just on or just under the layer in which the first wiring and the second wiring are arranged.

* * * * *